(12) United States Patent
Lee

(10) Patent No.: US 9,691,879 B2
(45) Date of Patent: Jun. 27, 2017

(54) THREE-DIMENSIONAL MEMORY DEVICE AND METHOD OF MANUFACTURING THE SAME

(71) Applicant: SK hynix Inc., Icheon-si Gyeonggi-do (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/817,770

(22) Filed: Aug. 4, 2015

(65) Prior Publication Data

US 2016/0260716 A1 Sep. 8, 2016

(30) Foreign Application Priority Data

Mar. 3, 2015 (KR) ........................ 10-2015-0029791

(51) Int. Cl.
*H01L 29/06* (2006.01)
*H01L 29/66* (2006.01)
(Continued)

(52) U.S. Cl.
CPC .. *H01L 29/66666* (2013.01); *H01L 27/11519* (2013.01); *H01L 27/11565* (2013.01);
(Continued)

(58) Field of Classification Search
CPC ......... H01L 27/11582; H01L 27/11521; H01L 27/11519; H01L 27/11568; H01L 27/11578; H01L 27/11556; H01L 27/108; H01L 27/10897; H01L 27/11; H01L 27/1116; H01L 29/04; H01L 29/16; H01L 29/24; H01L 29/4234; H01L 29/42324; H01L 29/518; H01L 29/7513; H01L 29/889; H01L 29/66825; H01L 29/66833; H01L 29/66969; H01L 29/7926;
(Continued)

(56) References Cited

U.S. PATENT DOCUMENTS

2011/0019480 A1* 1/2011 Kito ................. H01L 27/11565
365/185.18
2011/0180866 A1* 7/2011 Matsuda ........... H01L 27/11573
257/324
(Continued)

FOREIGN PATENT DOCUMENTS

KR 100943139 B1 2/2010
KR 10-2015-0116510 A 10/2015

*Primary Examiner* — Natalia Gondarenko
(74) *Attorney, Agent, or Firm* — William Park & Associates Ltd.

(57) ABSTRACT

Disclosed is a semiconductor device. The semiconductor device may include a first pipe gate including a trench extended in a first direction. The semiconductor device may include a second pipe gate formed in the first direction and spaced apart from the surface of the trench, and configured to divide the trench into a first space and a second space. The semiconductor device may include a partition pipe gate extended in a second direction crossing the first direction, and configured to divide the first space into first areas, and divide the second space into second areas. The semiconductor device may include a first pipe channel formed inside each of the first areas, and a second pipe channel formed inside each of the second areas.

10 Claims, 20 Drawing Sheets

(51) Int. Cl.
*H01L 29/78* (2006.01)
*H01L 27/11519* (2017.01)
*H01L 27/11565* (2017.01)
*H01L 27/02* (2006.01)
*H01L 27/11556* (2017.01)
*H01L 27/11582* (2017.01)

(52) U.S. Cl.
CPC ...... H01L 29/0649 (2013.01); H01L 29/7827 (2013.01); *H01L 27/11556* (2013.01); *H01L 27/11582* (2013.01)

(58) Field of Classification Search
CPC ......... H01L 21/28282; H01L 21/28518; H01L 21/28273; H01L 21/306; H01L 21/3105; H01L 21/31111; H01L 21/31116; H01L 21/465; H01L 21/469; H01L 21/47573; H01L 21/76877; H01L 29/66666; H01L 29/0649; H01L 29/7827; H01L 27/11565
USPC ........ 257/314, 324, 330, 364; 438/592, 270, 438/268, 591
See application file for complete search history.

(56) References Cited

U.S. PATENT DOCUMENTS

2013/0100722 A1\* 4/2013 Shin .................. H01L 27/11582
 365/51
2013/0153978 A1\* 6/2013 Lee ................... H01L 29/66833
 257/314
2013/0240994 A1\* 9/2013 Lee ..................... H01L 29/4238
 257/364

\* cited by examiner

THREE-DIMENSIONAL MEMORY DEVICE AND METHOD OF MANUFACTURING THE SAME

CROSS-REFERENCE TO RELATED APPLICATION

The present application claims priority to Korean patent application number 10-2015-0029791 filed on Mar. 3, 2015, in the Korean Intellectual Property Office, the entire disclosure of which is incorporated by reference herein.

BACKGROUND

1. Technical Field

Various embodiments generally relate to a semiconductor device and a method of manufacturing the same, and more particularly, to a three-dimensional memory device and a method of manufacturing the same.

2. Related Art

A semiconductor device includes a memory device capable of storing data. The memory device includes a memory cell array region, in which memory cell strings are disposed. The memory device also includes a peripheral circuit region, in which a peripheral circuit for driving the memory cell strings is disposed.

To increase the integration of semiconductor devices, a three-dimensional (3D) memory device has been suggested. In a three-dimensional (3D) memory device memory cells configuring memory cell strings are stacked on a substrate and the memory cells are three-dimensionally arranged. Recently, techniques for further improving integration of the 3D memory device have been developed. Further, various techniques for simplifying a manufacturing process of the 3D memory device have been developed.

SUMMARY

According to an embodiment, there may be provided a semiconductor device. The semiconductor device may include a first pipe gate including a trench extended in a first direction. The semiconductor device may include a second pipe gate formed in the first direction and spaced apart from the surface of the trench, and configured to divide the trench into a first space and a second space. The semiconductor device may include a partition pipe gate extended in a second direction crossing the first direction, and configured to divide the first space into first areas, and divide the second space into second areas. The semiconductor device may include a first pipe channel formed inside each of the first areas, and a second pipe channel formed inside each of the second areas.

The second pipe channel has a length in the second direction. The first pipe channel has a length in the second direction. The length of the second pipe channel is less than the length of the first pipe channel.

According to an embodiment, there may be provided a semiconductor device. The semiconductor device may include a first pipe gate including a trench extended in a first direction, and a second pipe gate formed according to a shape of a surface of the trench while being spaced apart from the surface of the trench. The second pipe gate may be configured to divide the trench into a first space and a second space. The semiconductor device may include a partition pipe gate extended in a second direction crossing the first direction. The semiconductor device may be configured to divide the first space adjacent to the surface of the trench into first channel areas, and divide the second space into second channel areas. The semiconductor device may include a first pipe channel formed inside each of the first channel areas, and a second pipe channel formed inside each of the second channel areas.

The semiconductor device may further include a drain side stack structure on the second pipe gate while surrounding the first drain side channel and the second drain side channel, and a source side stack structure on the second pipe gate while surrounding the first source side channel and the second source side channel. The source side stack structure and the drain side stack structure have substantially the same height.

According to an embodiment, there may be provided a method of manufacturing a semiconductor device. The method of manufacturing the semiconductor device may include forming a trench extended in a first direction within a first pipe gate. The method of manufacturing the semiconductor device may include forming a trench filled structure including a first sacrificial layer along a surface of the trench, a second pipe gate along a surface of the first sacrificial layer, and a second sacrificial layer filled in a center area of the trench opened by the second pipe gate inside the trench. The method of manufacturing the semiconductor device may include forming a partition pipe gate disposed within the trench in a second direction crossing the first direction to divide the first sacrificial layer into first sacrificial patterns and to divide the second sacrificial layer into second sacrificial patterns.

DETAILED DESCRIPTION

Hereinafter, an various examples of embodiments will be described with reference to the accompanying drawings. However, the embodiments are not limited to the examples disclosed below, but may be variously implemented in different forms, and the scope of the description is not limited to the embodiments to be described below.

Various embodiments may provide for a semiconductor device capable of improving the integration of a three-dimensional memory device through a simplified process, and a method of manufacturing the same.

Figure 1A:
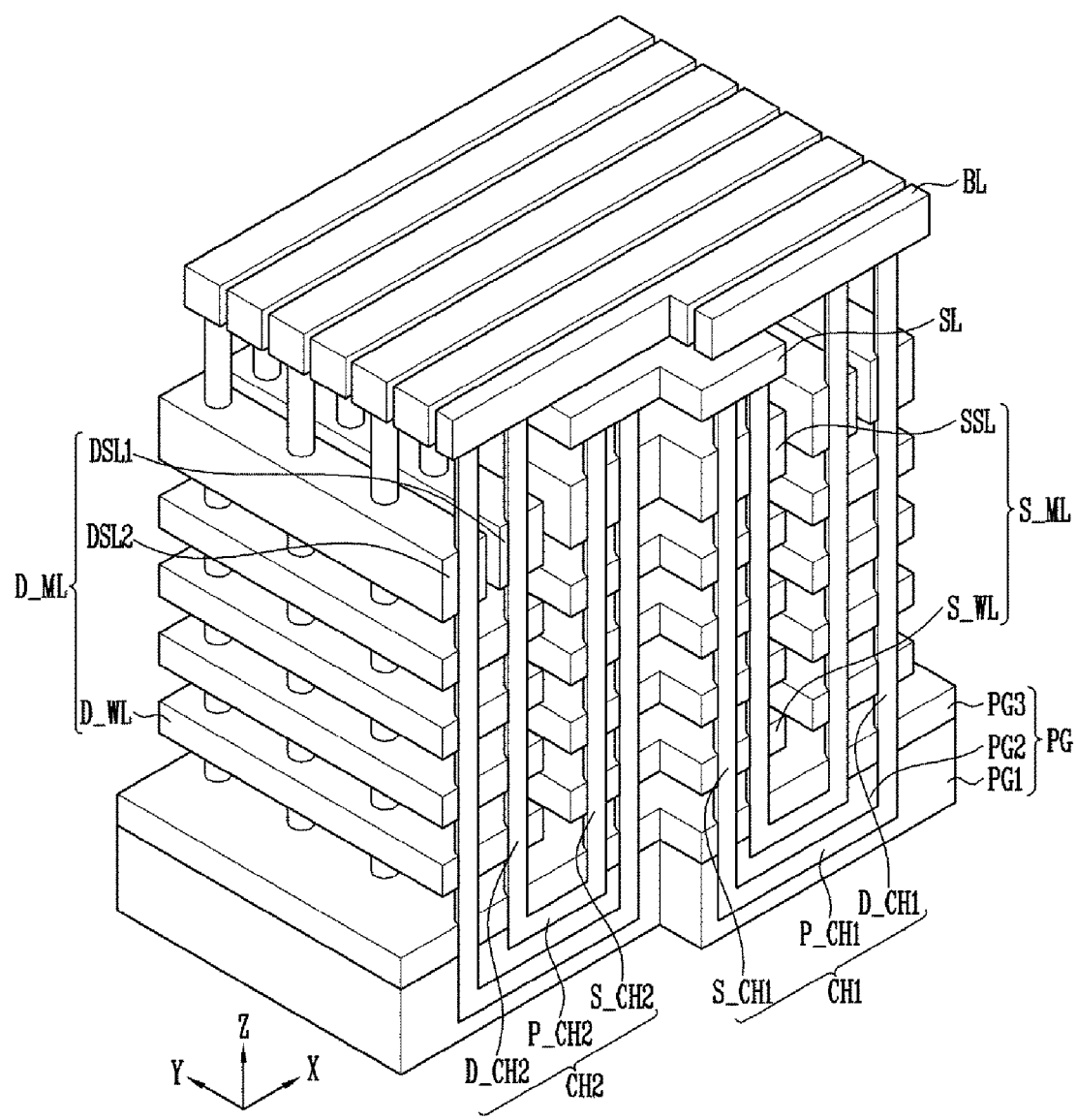
FIGS. 1A to 1D are diagrams illustrating a representation of an example of a semiconductor device according to an embodiment.
Figure 1B:
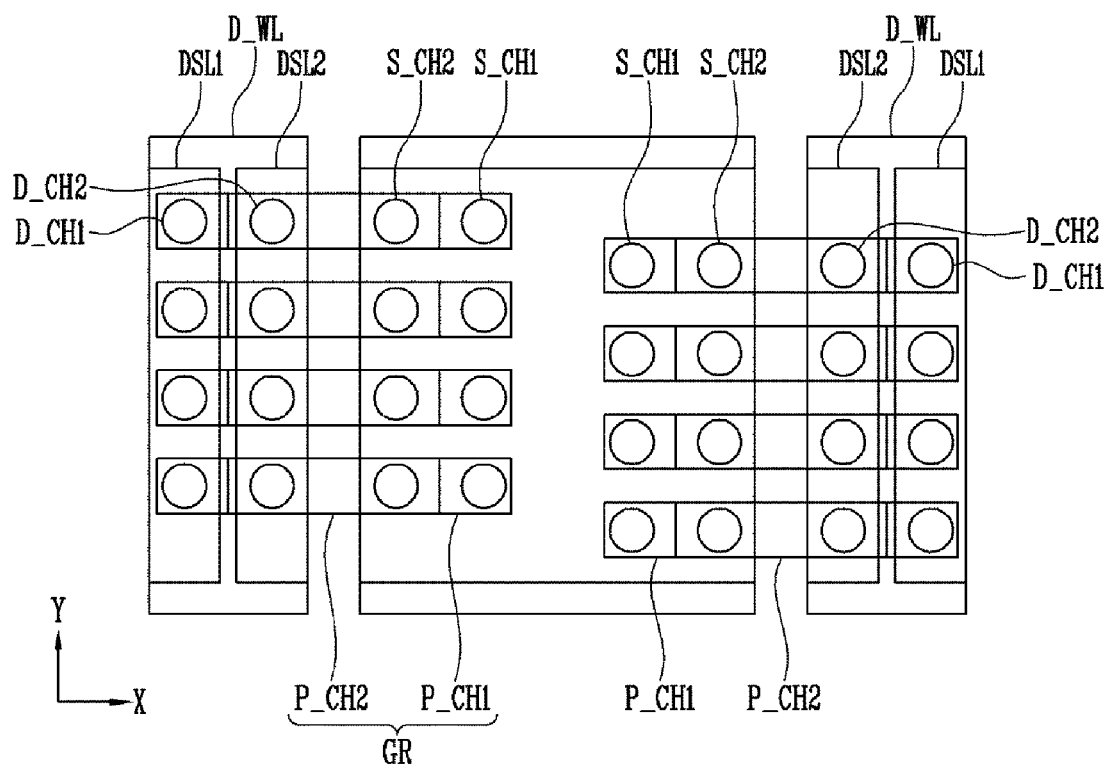
Figure 1C:
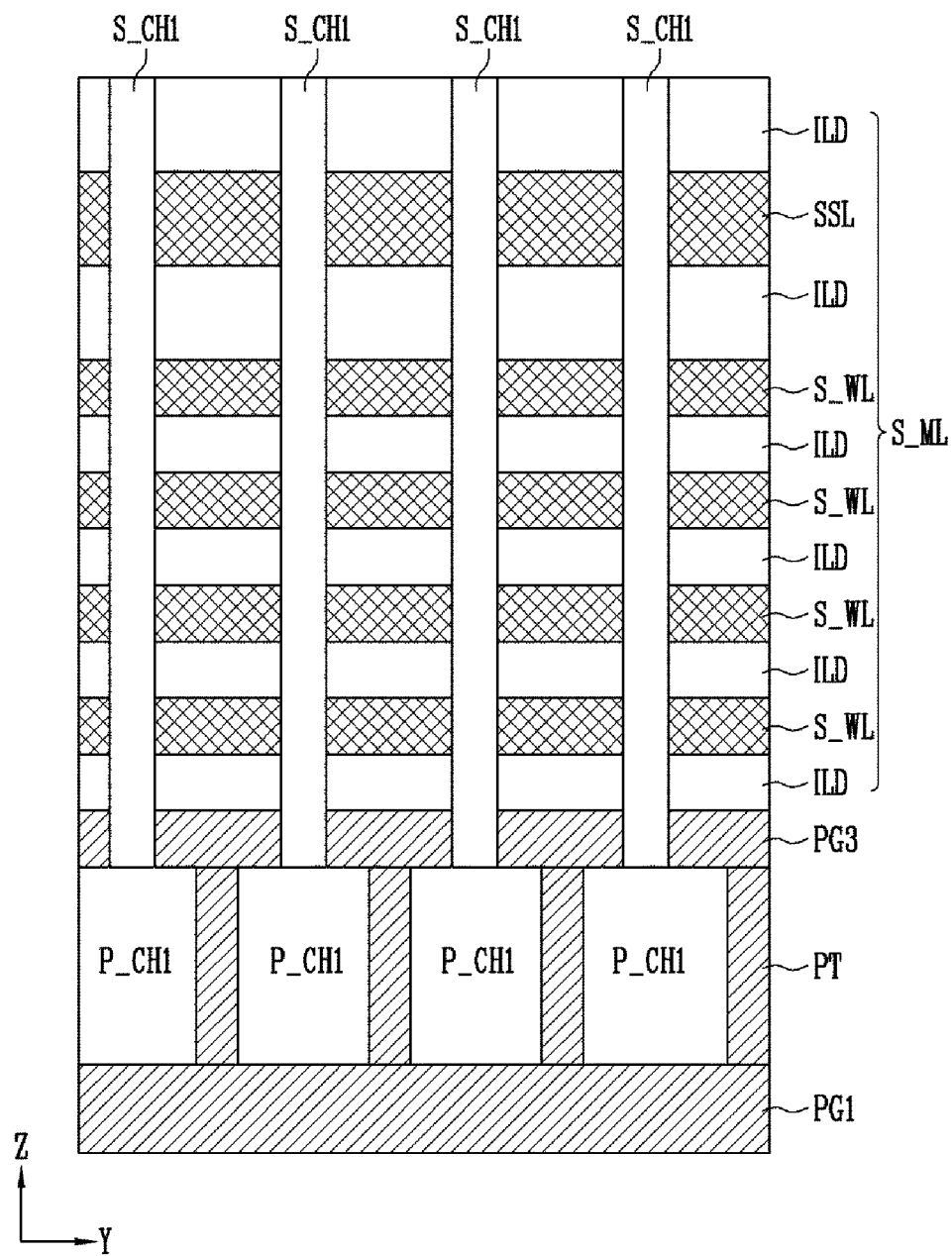
Figure 1D:
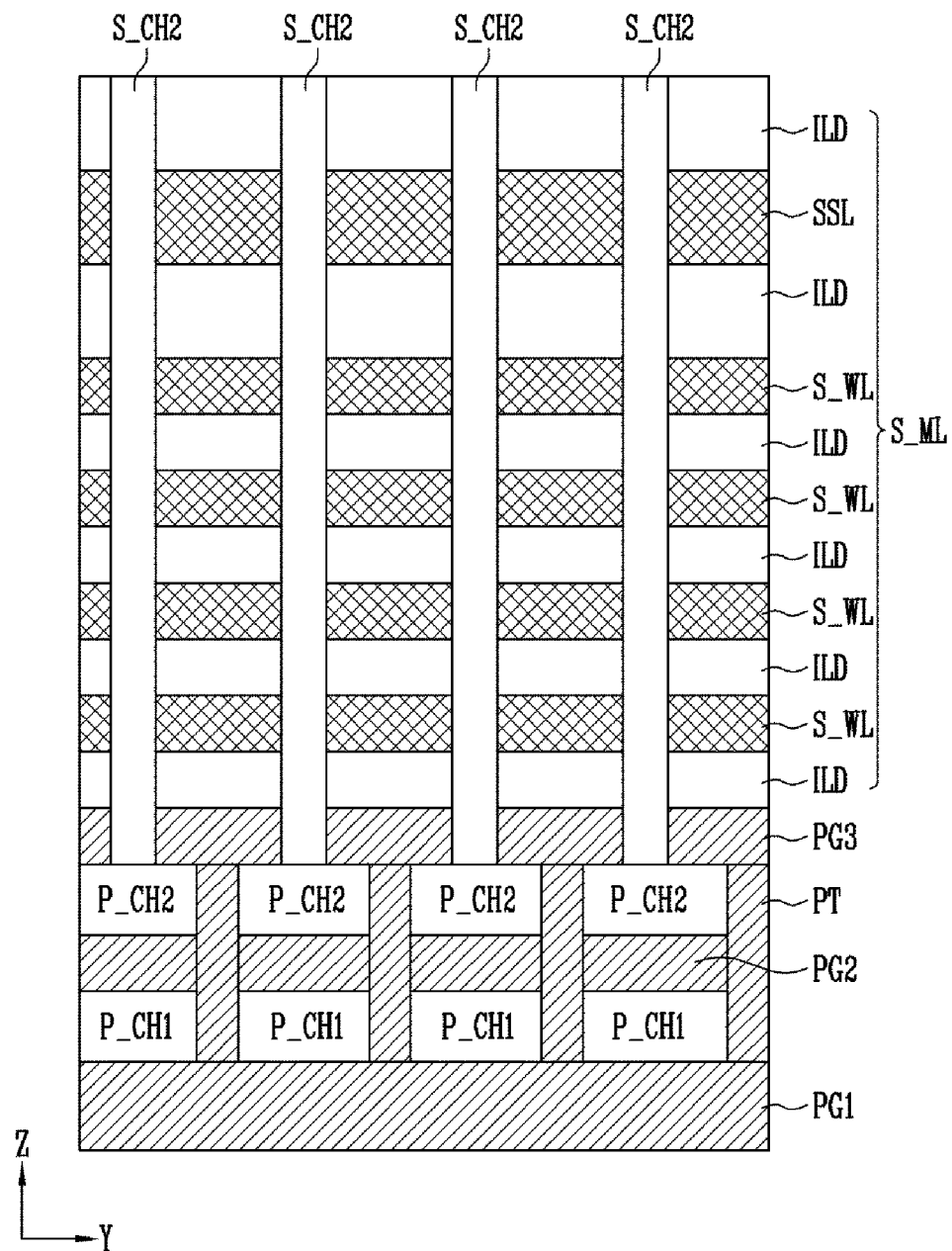

FIGS. 1A to 1D are diagrams illustrating a representation of an example of a semiconductor device according to an embodiment. More particularly, FIG. 1A is a perspective view of a three-dimensional (3D) memory device according to an example of an embodiment. In FIG. 1A, an insulating layer is not illustrated. FIG. 1B is a layout view illustrating representations of examples of channels and conductive patterns of the 3D memory device according to an embodiment. FIG. 1C is a cross-sectional view of a representation of an example of a crossing part of a source select line and a first source side channel. FIG. 1D is a cross-sectional view of a representation of an example of a crossing part of a source select line and a second source side channel.

Referring to FIG. 1A, the 3D memory device according to an embodiment may include a first channel layer CH1, a second channel layer CH2, a pipe gate PG, a source side stack structure S_ML, and a drain side stack structure D_ML.

The pipe gate PG may include a first pipe gate PG1, a second pipe gate PG2, and a partition pipe gate PT (illustrated in FIGS. 1C and 1D). The pipe gate PG may further include a third pipe gate PG3 covering the first and second pipe gates PG1 and PG2 and the partition pipe gate PT.

The first pipe gate PG1 includes a trench extended in a first direction (for example, a Y-direction). The second pipe gate PG2 and the partition pipe gate PT are disposed inside the trench of the first pipe gate PG1. The second pipe gate PG2 and the partition pipe gate PT are formed to divide the trench of the first pipe gate PG1 into first channel areas and second channel areas. Structures of the first pipe gate PG1, the second pipe gate PG2, and the partition pipe gate PT will be described in below with reference to FIGS. 2A to 2D.

The first channel layer CH1 may include a first pipe channel P_CH1, a first source side channel S_CH1, and a first drain side channel D_CH1. The first source side channel S_CH1 and the first drain side channel D_CH1 are extended from the first pipe channel P_CH1 on the same plane as an upper surface of the second pipe gate PG2 to further protrude upwardly more than the second pipe gate PG2. The first pipe channel P_CH1 is formed inside the first channel area defined by the first pipe gate PG1, the second pipe gate PG2, and the partition pipe gate PT. The first source side channel S_CH1 and the first drain side channel D_CH1 pass through the third pipe gate PG3.

The second channel layer CH2 may include a second pipe channel P_CH2, a second source side channel S_CH2, and a second drain side channel D_CH2. The second source side channel S_CH2 and the second drain side channel D_CH2 are extended from the second pipe channel P_CH2 on the same plane as the upper surface of the second pipe gate PG2 to further protrude upwardly more than the second pipe gate PG2. The second pipe channel P_CH2 is formed inside the second channel area defined by the first pipe gate PG1, the second pipe gate PG2, and the partition pipe gate PT. The second source side channel S_CH2 and the second drain side channel D_CH2 pass through the third pipe gate PG3.

The first and second channel areas are divided with the second pipe gate PG2 interposed therebetween. The first channel area is an area disposed under the second pipe gate PG2, and the second channel area is an area disposed above the second pipe gate PG2.

Bottom surfaces of the first and second source side channels S_CH1 and S_CH2 and the first and second drain side channels D_CH1 and D_CH2 may be disposed on the same plane. Accordingly, it may be possible to simplify a process of forming holes in which the first and second source side channels S_CH1 and S_CH2 and the first and second drain side channels D_CH1 and D_CH2 are disposed.

The first pipe channel P_CH1 may have a U-shaped longitudinal section structure including a first part parallel to the second pipe channel P_CH2 and protrusions protruding from the first part to the bottom surface of the first source side channel S_CH1 and the first drain side channel D_CH1. An entire surface of the upper surface of the second pipe channel P_CH2 may be disposed on the same plane as the bottom surface of the second source side channel S_CH2 and the second drain side channel D_CH2, and may be formed to be flat.

Each of the first channel layer CH1 and the second channel layer CH2 is disposed inside the through-hole defined according to a shape thereof. The first channel layer CH1 and the second channel layer CH2 may be formed of a tube-type semiconductor layer surrounding an insulating material filled in a center area of the through-hole. In an embodiment, each of the first channel layer CH1 and the second channel layer CH2 may be formed of a buried semiconductor layer filled from a surface of the through hole to a center area of the through-hole. In an embodiment, each of the first channel layer CH1 and the second channel layer CH2 may be formed in a structure in which a buried type and a tube type are combined. Although not illustrated in the drawing, an external wall of each of the first channel layer CH1 and the second channel layer CH2 may be surrounded by a multilayer of three or more layers including a tunnel insulating layer, a data storing layer, and a blocking insulating layer.

The source side stack structure S_ML and the drain side stack structure D_ML may be separated by a slit. The separation structure of the source side stack structure S_ML and the drain side stack structure D_ML may be variously changed according to a form of the slit.

The source side stack structure S_ML is passed through by the first source side channel S_CH1 and the second source side channel S_CH2. The source side stack structure S_ML may include source side word lines S_WL. The source side word lines S_WL are stacked while being spaced apart from each other. The source side stack structure S_ML may include a source select line SSL of one or more layers stacked on the source side word lines S_WL. The source select line SSL may be formed with the same thickness as that of the source side word lines SL_WL, or with a larger thickness than that of the source side word lines SL_WL. The source select line SSL is spaced apart from the source side word lines S_WL. The source side word lines S_WL and the source select line SSL may be extended in the first direction (for example, the Y-direction) while surrounding the first source side channel S_CH1 and the second source side channel S_CH2.

The drain side stack structure D_ML is passed through by the first drain side channel D_CH1 and the second drain side channel D_CH2. The drain side stack structure D_ML includes drain side word lines D_WL. The drain side word lines D_WL are stacked while being spaced apart from each other. The drain side stack structure D_ML includes drain select lines DSL1 and DSL2 of one or more layers stacked on the drain side word lines D_WL. The drain select lines DSL1 and DSL2 are spaced apart from the drain side word lines D_WL. The drain select lines DSL1 and DSL2 may be divided into a first drain select line DSL1 surrounding the first drain side channel D_CH1, and a second drain select line DSL2 surrounding the second drain side channel D_CH2. The drain side word lines D_WL and the drain select lines DSL1 and DSL2 may be extended in the first direction (for example, the Y-direction) while surrounding the first drain side channel D_CH1 and the second drain side channel D_CH2.

The source side stack structure S_ML and the drain side stack structure D_ML may be formed with the same height or substantially the same height. A source line SL and bit lines BL are disposed on the source side stack structure S_ML and the drain side stack structure D_ML. The source line SL and the bit lines BL are disposed while being spaced apart from each other. For example, the bit lines BL may be spaced apart from the source line SL to be disposed on the source line SL.

The source line SL is commonly connected to the first source side channel S_CH1 and the second source side channel S_CH2. The source line SL may be extended in the first direction (Y-direction).

The bit lines BL may be extended in a second direction (for example, an X-direction) crossing the first direction (Y-direction). The bit lines BL are connected to the first and second drain side channels D_CH1 and D_CH2 arranged in the extended directions thereof, respectively.

According to the aforementioned structure, a pipe transistor is formed at a crossing part of the pipe gate PG and the first channel layer CH1 or a crossing part of the pipe gate PG and the second channel layer CH2. Memory cells are formed at crossing parts of the word lines D_WL and S_WL and the first channel layer CH1 or crossing parts of the word lines D_WL and S_WL and the second channel layer CH2. A source select transistor is formed at a crossing part of the source select line SSL and the first channel layer CH1 or a crossing part of the source select line SSL and the second channel layer CH2. A drain select transistor is formed at a crossing part of the first drain select lines DSL1 and the first channel layer CH1 or a crossing part of the second drain select lines DSL2 and the second channel layer CH1. Accordingly, a first memory string including the drain select transistor, the memory cells, the pipe transistor, and the source select transistor serially connected by the first channel layer CH1 is connected between one bit line BL and the source line SL. Further, a second memory string including the drain select transistor, the memory cells, the pipe transistor, and the source select transistor serially connected by the second channel layer CH2 is connected between one bit line BL and the source line SL. An area in which the second memory string is formed may be defined within an area occupied by the first memory string, thereby improving integration of the memory device within a limited space in an example of an embodiment.

Referring to FIG. 1B, the second pipe channel P_CH2 overlaps the first pipe channel P_CH1. The second drain side channel D_CH2 and the second source side channel S_CH2 may be connected to both ends of the second pipe channel P_CH2.

The second pipe channel P_CH2 is formed to be shorter than the first pipe channel P_CH1 so that both ends of the first pipe channel P_CH1 is exposed by the second pipe channel P_CH2. Accordingly, the first drain side channel D_CH1 and the first source side channel S_CH1 may be connected to both ends of the first pipe channel P_CH1.

Pipe channel groups GR each including the first and second pipe channels P_CH1 and P_CH2 overlapping each other may be arranged in a matrix form in the first direction (Y-direction) and the second direction (for example, the X-direction) orthogonal to the first direction (Y-direction). Further, the pipe channel groups GR may be arranged in a zigzag form in order to improve integration of the memory device. For example, the pipe channel groups GR may be arranged to be parallel in the first direction (Y-direction), and may be arranged so that centers thereof are dislocated in the second direction (X-direction).

The source select line SSL may be formed while simultaneously surrounding the first source side channels S_CH1 in two columns and the second source side channels S_CH2 in the two columns, which are adjacent to each other. In an embodiment, the source select line SSL may be divided into first to fourth line parts surrounding the first source side channels S_CH1 in two columns and the second source side channels S_CH2 in the two columns, which are adjacent to each other, in a unit of one column, respectively. In an embodiment, the source select line SSL may be divided into first and second line parts surrounding the first source side channels S_CH1 in two columns and the second source side channels S_CH2 in the two columns, which are adjacent to each other, in a unit of two columns, respectively.

The source side word lines S_WL may be formed while simultaneously surrounding the first source side channels S_CH1 in two columns and the second source side channels S_CH2 in the two columns which are adjacent to each other. In an embodiment, the source side word lines S_WL may be divided into first to fourth line parts surrounding the first source side channels S_CH1 in two columns and the second source side channels S_CH2 in the two columns in a unit of one column, which are adjacent to each other, respectively. In an embodiment, the source side word lines S_WL may be divided into first and second line parts surrounding the first source side channels S_CH1 in two columns and the second source side channels S_CH2 in the two columns, which are adjacent to each other, in a unit of one column, respectively.

The drain select lines DSL1 and DSL2 may be divided into a first drain select line DSL1 surrounding the first drain side channel D_CH1 in one column, and a second drain select line DSL2 surrounding the second drain side channel D_CH2 in the one column. In an embodiment, the first drain side channel D_CH1 in the one column and the second drain side channel D_CH2 in the one column, which are adjacent to each other, may be simultaneously surrounded by one drain select line.

The drain side word lines D_WL may be formed while simultaneously surrounding the first source side channel S_CH1 in one column and the second source side channel S_CH2 in the one column, which are adjacent to each other. In an embodiment, the drain side word lines D_WL may be divided into a first line parts surrounding the first drain side channel D_CH1 in one column and a second line part surrounding the second drain side channel D_CH2 in the one column, which are adjacent to each other.

Referring to FIGS. 1C and 1D, the second pipe channel P_CH2 overlaps the first pipe channel P_CH1 with the second pipe gate PG2 interposed therebetween. Areas, in which the first pipe channel P_CH1 and the second pipe channel P_CH2 are formed, may be divided by the partition pipe gate PT passing through the second pipe gate PG to be in contact with a surface of the first pipe gate PG1. The first pipe channel P_CH1 is formed to be higher in an area non-overlapping the second pipe channel P_CH2 than an area overlapping the second pipe channel P_CH2.

The third pipe gate PG3 is formed to cover the partition pipe gate PT, the first and second pipe gates PG1 and PG2, and the first and second pipe channels P_CH1 and P_CH2, and is passed through by the first and second drain side channels D_CH1 and D_CH2 (see FIG. 1A) and the first and second source side channels S_CH1 and S_CH2.

The source side stack structure S_ML and the drain side stack structure D_ML (see FIG. 1A) may include interlayer insulating patterns ILD and the conductive patterns S_WL, SSL, D_WL, DSL1 or DSL2 (see FIG. 1A) which are alternately stacked. The conductive patterns of the source side stack structure S_ML may include the source side word lines S_WL and the source select line SSL. The conductive patterns of the drain side stack structure D_ML may include the drain side word lines D_WL (see FIG. 1A) and the drain select lines DSL1 and DSL2.

Figure 2A:
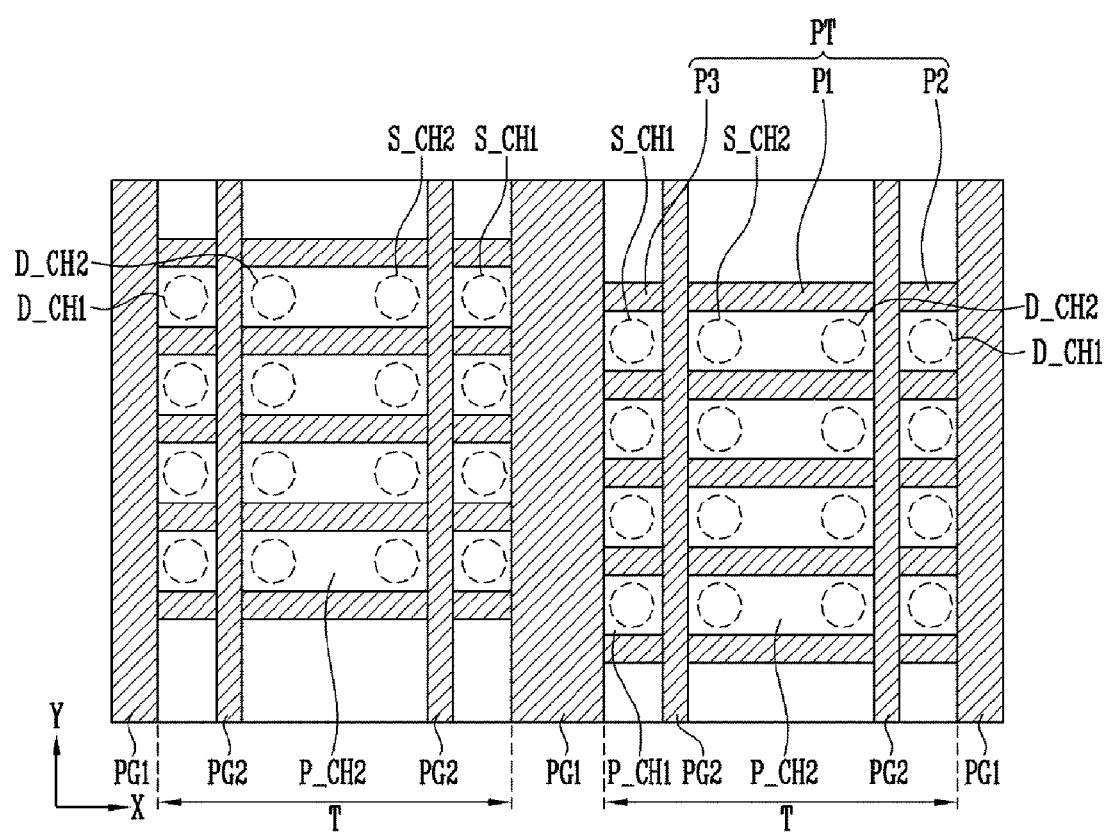
FIGS. 2A to 2D are diagrams illustrating a representation of an example of a structure of a pipe gate according to an embodiment.
Figure 2B:
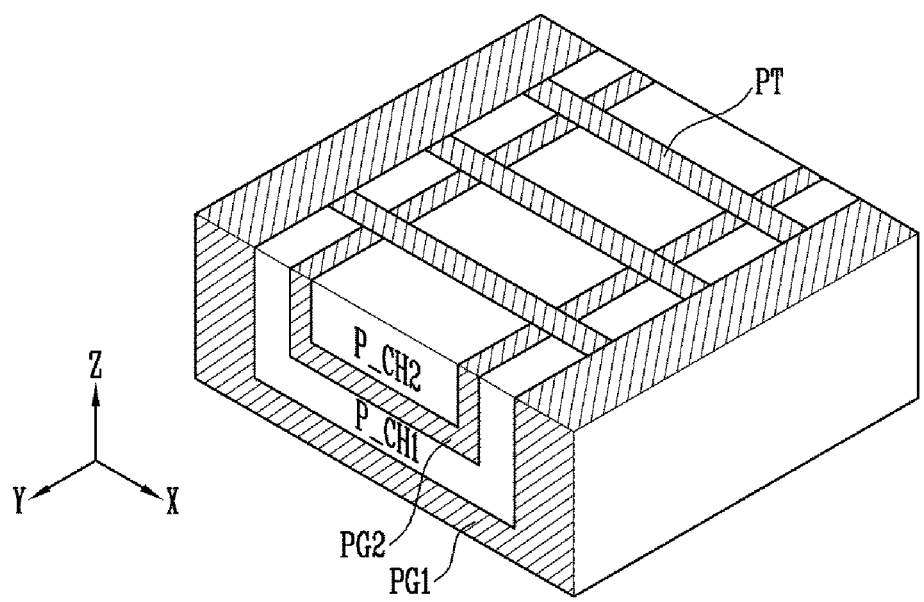
Figure 2C:
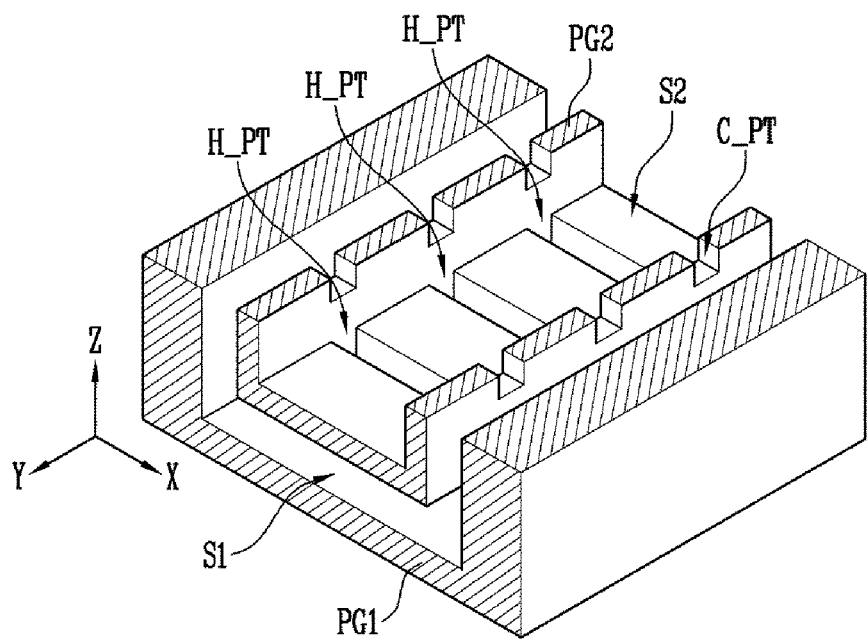
Figure 2D:
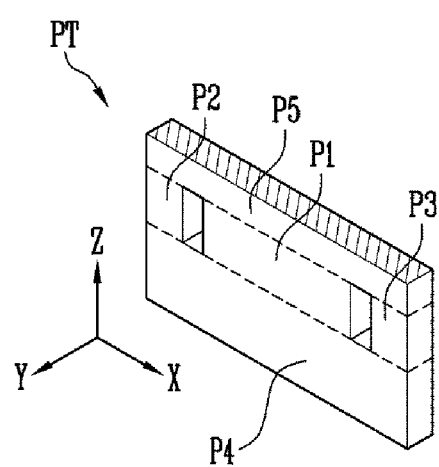

FIGS. 2A to 2D are diagrams illustrating a representation of an example of a structure of the pipe gate according to an embodiment. More particularly, FIG. 2A is a top plan view illustrating a representation of an example of the pipe gate structure formed under the source side stack structure and the drain side stack structure. FIG. 2B is a perspective view of the pipe gate embedded with the first and second pipe channels. FIG. 2C is a perspective view of the first and second pipe gates. FIG. 2D is a perspective view of the partition pipe gate.

Referring to FIGS. 2A to 2D, the first pipe gate PG1 may include a trench T extended in the first direction (for example, the Y-direction). The trench T may be extended in the second direction (for example, the X-direction) crossing the first direction (Y-direction). The first pipe gate PG1 including the trench T may have a U-shaped longitudinal section structure.

The second pipe gate PG2 is spaced apart from a surface of the trench T to be formed according to a shape of the surface of the trench T. Accordingly, the second pipe gate PG2 may have a U-shaped longitudinal section structure. The trench T may be divided into a first space S1 adjacent to the surface of the trench T and a second space S2 above the second pipe gate PG2 by the second pipe gate PG2. The first space S1 may be formed according to the shape of the surface of the trench T, and may have a U-shaped longitudinal section structure. The first space S1 and the second pipe gate PG2 having the U-shaped longitudinal section structure are extended in the first direction (Y-direction) that is the extension direction of the trench T.

The partition pipe gate PT is extended in the direction crossing the first direction (Y-direction). For example, the partition pipe gate PT may be extended in the second direction (for example, the X-direction) vertically crossing the first direction (Y-direction). The partition pipe gate PT divides the first space S1 into the first channel areas in which the first pipe channels P_CH1 are disposed, and divides the second space S2 into the second channel areas in which the second pipe channels P_CH2 are disposed. To this end, the partition pipe gate PT may include a first pattern P1, second and third patterns P2 and P3 facing with the first pattern P1 of the partition pipe gate PT interposed therebetween, and a fourth pattern P4 and a fifth pattern P5 connecting the first to third patterns P1 to P3.

The first pattern P1 is a part extended in an extended direction of the partition pipe gate PT to be in contact with the second pipe gate PG2. The first pattern P1 is extended to pass through a bottom surface of the second pipe gate PG2 from an internal side of the second space S2. The second pipe gate PG2 has partition holes H_PT into which the first pattern P1 is insertable. The partition holes H_PT may be arranged in series in the extended direction of the second pipe gate PG2.

The second pattern P2 and the third pattern P3 are parts disposed in an extended line of the first pattern P1, and connected between a lateral wall of the second pipe gate PG2 and a lateral wall of the first pipe gate PG1 within the first space S1 at both sides of the first pattern P1.

The fourth pattern P4 is a part extended from bottom surfaces of the first to third patterns P1 to P3 to the surface of the trench T.

The fifth pattern part P3 is a part extended from upper surfaces of the first to third patterns P1 to P3 to a height of an upper surface of the first pipe gate PG1. The fifth pattern P5 is connected between the lateral walls of the trench T which face each other. The fifth pattern P5 may be formed while passing through both ends of the second pipe gate PG2 at a predetermined thickness. The second pipe gate PG2 may have concave parts C_PT into which the fifth pattern P5 is insertable. The concave parts C_PT may be formed at both ends of the second pipe gate PG2, and arranged in the extended direction of the second pipe gate PG2.

The first space S1 may be divided into the first channel areas, in which the first pipe channels P_CH1 are disposed, by the second to fifth patterns P2 to P5. The second space S2 may be divided into the second channel areas, in which the second pipe channels P_CH2 are disposed, by the first and the fifth patterns P1 and P5.

The first drain side channel D_CH1 and the second pattern P2 may be alternately disposed in the extended direction of the trench T. The first source side channel S_CH1 and the third pattern P3 may be alternately disposed in the extended direction of the trench T. The pair of second drain side channel D_CH2 and second source side channel S_CH2, and the first pattern P1 may be alternately disposed in the extended direction of the trench T.

The partition pipe gates PT may be arranged in a zigzag form in the direction (X-direction) vertically crossing the extended direction of the trench T. More particularly, the partition pipe gates PT may be arranged so that the centers thereof are dislocated in the direction (X-direction) vertically crossing the extended direction of the trench T.

The partition pipe gate PT is in contact with the first and second pipe gates PG1 and PG2 to be electrically connected to with the first and second pipe gates PG1 and PG2. The second pipe gate PG2 may be electrically connected to the first pipe gate PG1 through the partition pipe gate PT. The third pipe gate PG3 illustrated in FIG. 1A is in contact with upper surfaces of the first and second pipe gates PG1 and PG2 and the partition pipe gate PT to be electrically connected to the first and second pipe gates PG1 and PG2 and the partition pipe gate PT.

Hereinafter, a method of manufacturing a semiconductor device according to an example of an embodiment will be described with reference to FIGS. 3A to 7F.

Figure 3A:
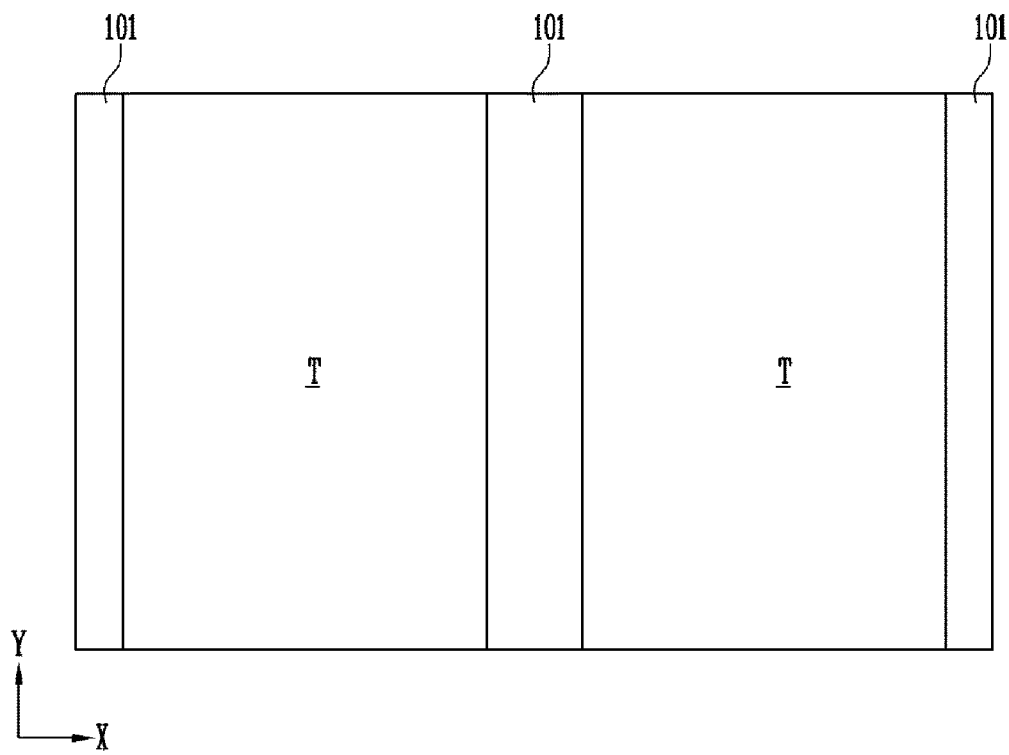
FIGS. 3A to 3B, 4A to 4B, 5A to 5D, 6A to 6B, and 7A to 7F are diagrams for describing a representation of an example of a method of a manufacturing method of a semiconductor device according to an embodiment.
Figure 3B:
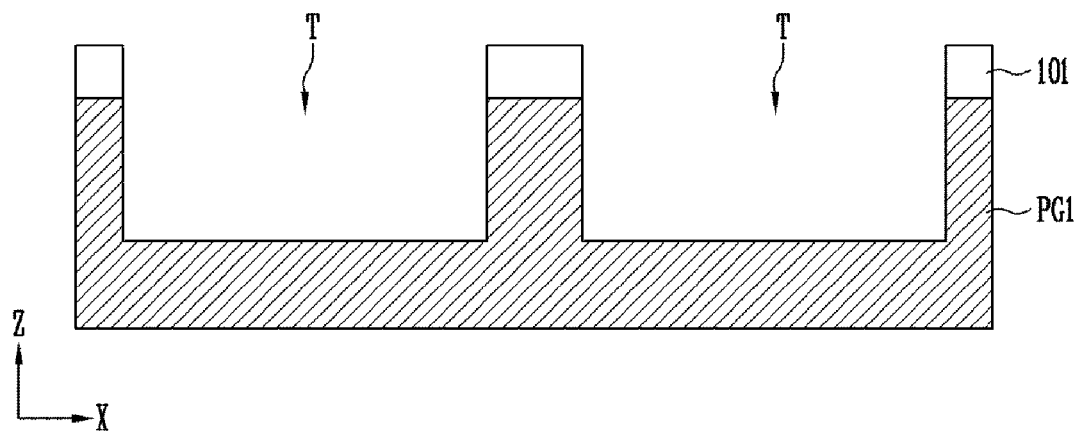

FIGS. 3A and 3B are a top plan view and a cross-sectional view for describing a representation of an example of a process of forming a trench of a 3D memory device according to an example of an embodiment, respectively.

Referring to FIGS. 3A and 3B, a first conductive layer is formed on a substrate, and then a first mask pattern 101 is formed on the first conductive layer. Then, an opening area of the first conductive layer is etched with a predetermined thickness by an etch process using the first mask pattern 101 as an etch barrier. Accordingly, a first pipe gate PG1 including trenches T may be formed.

The first conductive layer may include, for example, a poly silicon layer. The first mask pattern 101 may be removed after the trenches T are formed. The trench T may be extended in a first direction (for example, an Y-direction). The trenches T may be arranged in parallel in a direction (for example, an X-direction) crossing the extended direction (Y-direction) of the trench T.

Figure 4A:
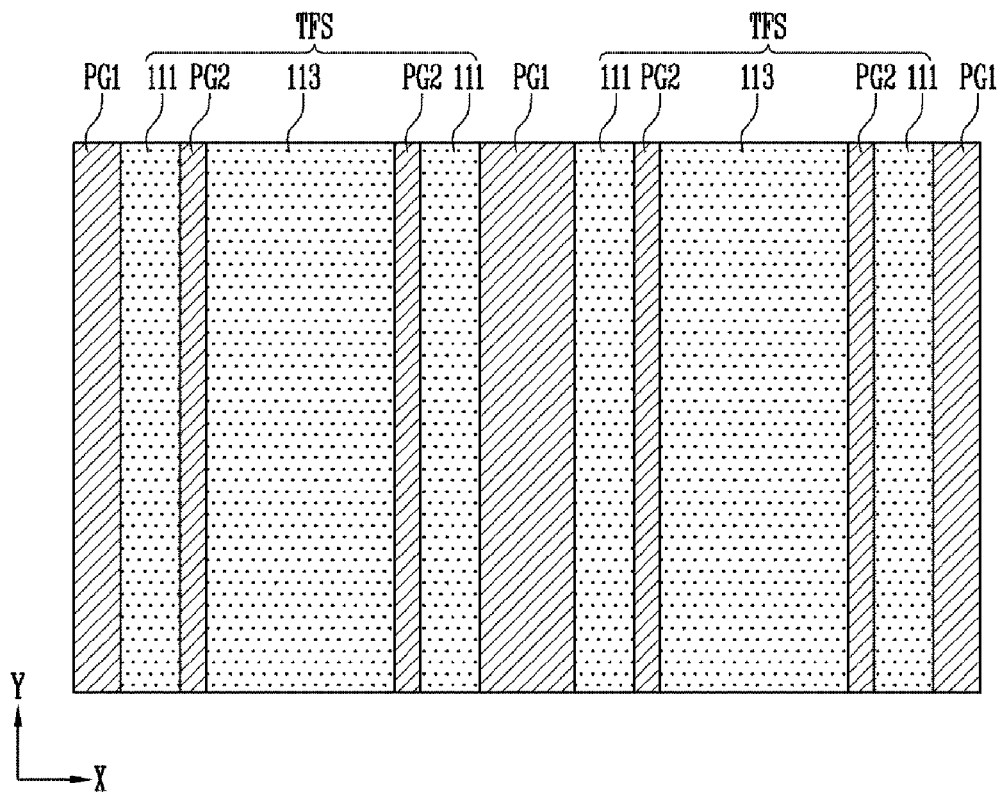
Figure 4B:
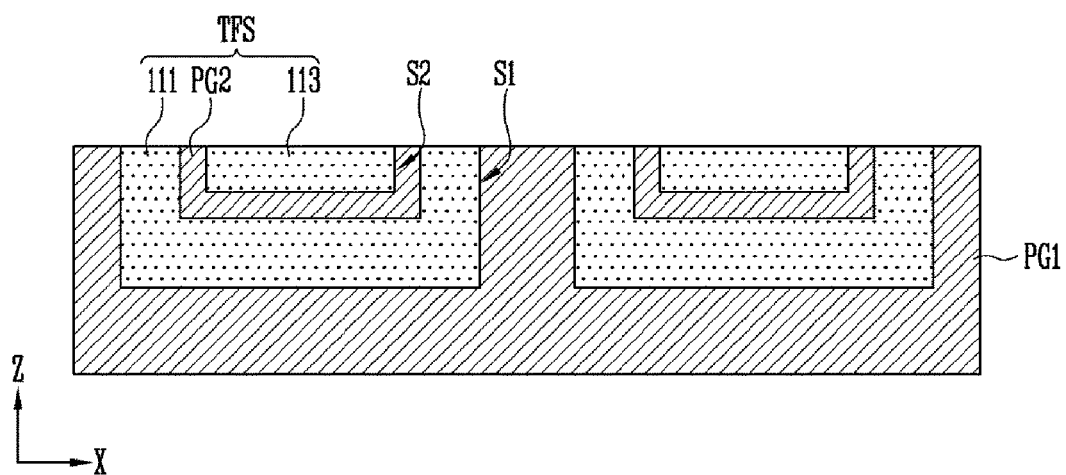

FIGS. 4A and 4B are a top plan view and a cross-sectional view for describing a representation of an example of a process of forming a trench filled structure.

Referring to FIGS. 4A and 4B, a first sacrificial layer 111 and a second conductive layer are sequentially stacked along surfaces of the trenches T. The first sacrificial layer 111 is formed of a different material from that of the first and second conductive layers. For example, the first sacrificial layer 111 may include TiN. The second conductive layer may include, for example, poly silicon as a conductive material used as a second pipe gate PG2. The second conductive layer may open a center area of the trench T, and may be formed according to a shape of the surface of the trench T.

Next, the center areas of the trenches T opened by the second conductive layer are filled with a second sacrificial layer 113. The second sacrificial layer 113 may be formed of a different material from that of the first and second conductive layers. The second sacrificial layer 113 may be formed of the same material as that of the first sacrificial layer 111. For example, the second sacrificial layer 113 may include TiN.

Then, surfaces of the second sacrificial layer 113, the second conductive layer, and the first sacrificial layer 111 are planarized to allow an upper surface of the first pipe gate PG1 to be exposed. Accordingly, a trench filled structure TFS including the second sacrificial layer, the second pipe gate PG2 formed of the second conductive layer, and the first sacrificial layer 111 is formed in a unit of the trench T. The trench filled structure TFS may be formed while an internal side of the trench T is completely filled. In the above description, the planarization may be performed by, for example but not limited to, a Chemical Mechanical Polishing (CMP) method.

According to the aforementioned process, in an example of an embodiment, the first sacrificial layer 111 and the second pipe gate PG2 are formed according to the shape of the surface of the trench T without separately performing a mask process. In an example of an embodiment, even though a separate mask process is not performed, the trench T may be divided into a first space S1 under the second pipe gate PG2 and a second space S2 above the second pipe gate PG2.

Figure 5A:
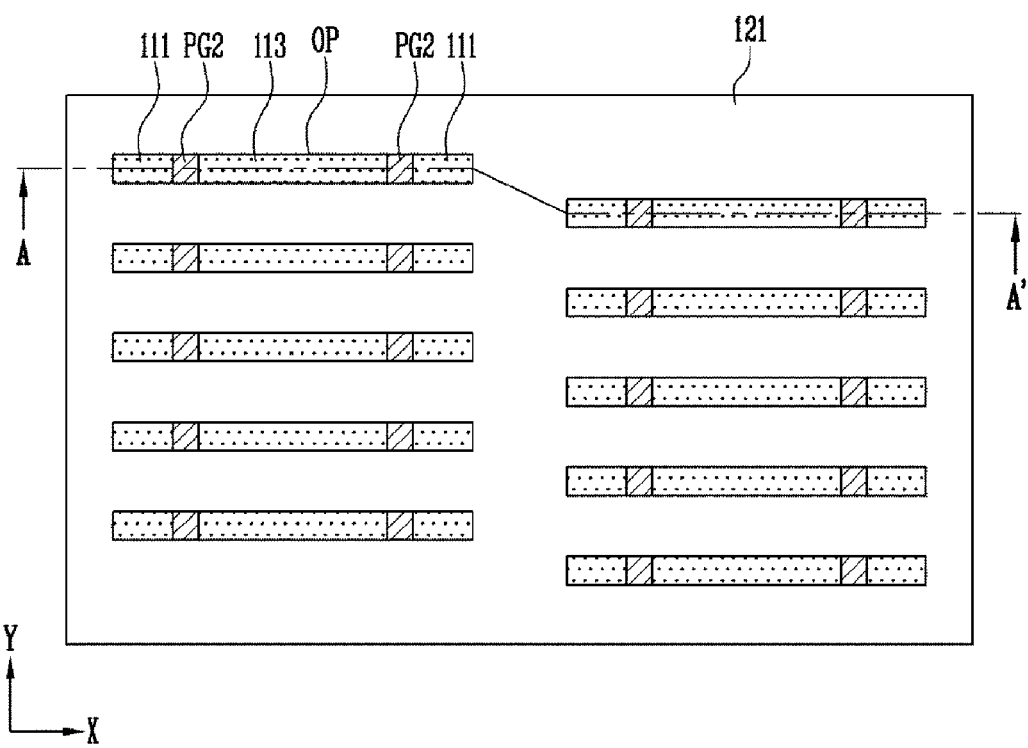
Figure 5B:
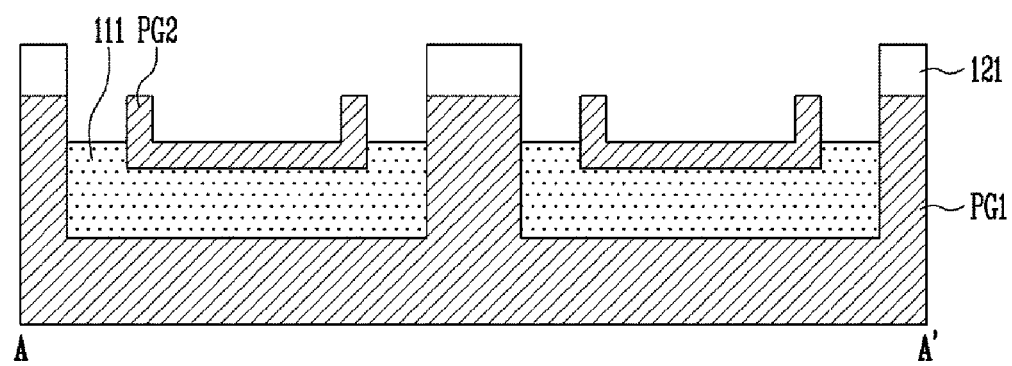
Figure 5C:
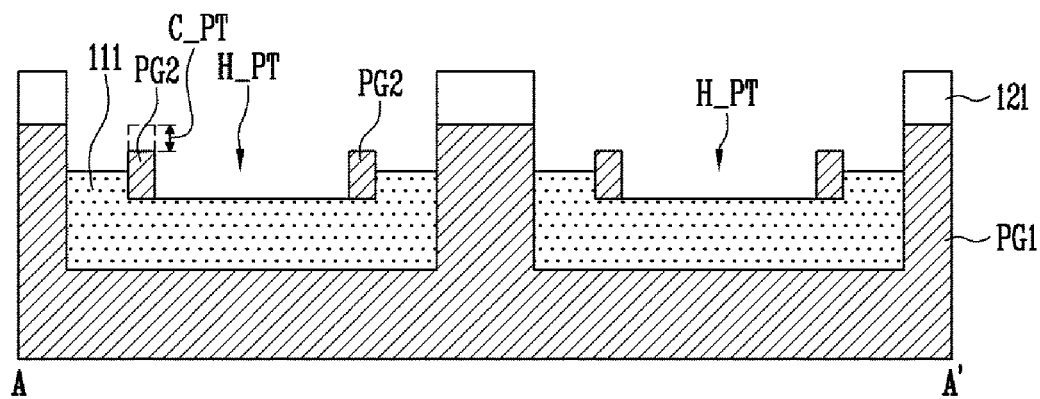
Figure 5D:
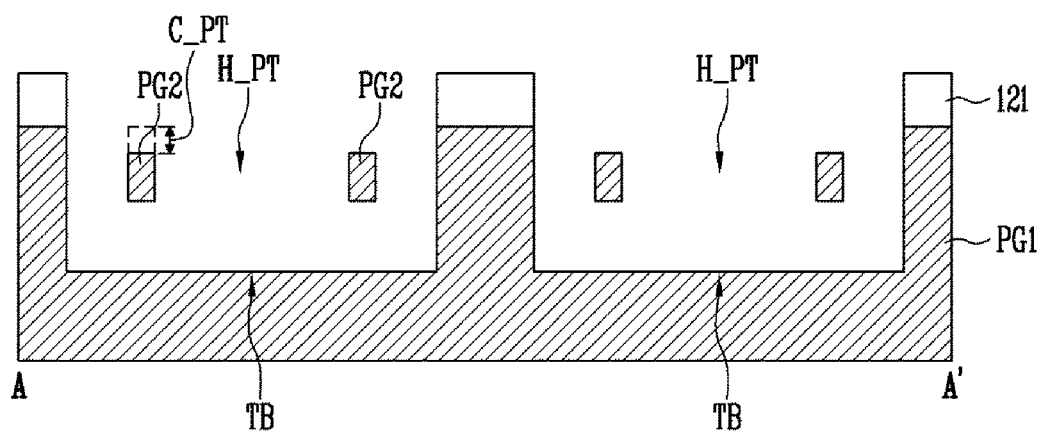

FIGS. 5A to 5D are a top plan view and cross-sectional views for describing a representation of an example of a process of dividing the first and second sacrificial layers into first and second sacrificial patterns. Particularly, FIG. 5A is a top plan view illustrating an example of a layout of a second mask pattern, and FIGS. 5B to 5D are cross-sectional views for each process step taken along line A-A' illustrated in FIG. 5A.

Referring to FIG. 5A, a second mask pattern 121 including openings OP for opening areas, in which partition pipe gates PT (see FIG. 5B) are to be formed, are formed on the first pipe gate PG1 including the trench filled structure TFS illustrated in FIG. 4A. The openings OP may be arranged in series in the extended direction (Y-direction) of the trench T (see FIG. 4A). The opening OP may vertically cross the extended direction (Y-direction) of the trench T (see FIG. 4A). The opening OP may be extended so that lateral walls of the trench, which face each other, are exposed. Accordingly, the lateral walls of the trench, which face each other, may be exposed by both ends of the opening OP. The openings OP may be arranged in a zigzag form in the direction (X-direction) vertically crossing the extended direction (Y-direction) of the trench T (see FIG. 4A). More particularly, the openings OP may be arranged so that the centers thereof are dislocated in the direction (X-direction) vertically crossing the extended direction of the trench T.

Referring to FIG. 5B, the first sacrificial layer 111 and the second sacrificial layer 113 are etched by using the second mask pattern 121 as an etch barrier until a bottom surface of the second pipe gate PG2 is exposed.

Referring to FIG. 5C, the second pipe gate PG2 is etched by using the second mask pattern 121 as the etch barrier so that partition holes H_PT passing through the bottom surface of the second pipe gate PG2 are formed. In this example, parts of both ends of the second pipe gate PG2, which are exposed by the opening OP, are etched, so that concave parts C_PT may be formed in the second pipe gate PG2. The concave parts C_PT are disposed in an extended line of the partition hole H_PT. The concave parts C_PT and the partition hole H_PT are located at different heights in the trench T. The first sacrificial layer 111 under the second pipe gate PG2 is exposed by the partition hole H_PT.

Referring to FIG. 5D, the sacrificial layer 111 (see FIG. 5C) is etched by using the second mask pattern 121 as the etch barrier until the bottom surface TB of the trench T is exposed.

By the processes described with reference to FIGS. 5A to 5D, the first sacrificial layer 111 may be divided into first sacrificial patterns, and the second sacrificial layer 113 may be divided into second sacrificial patterns. A boundary between the first sacrificial patterns and a boundary between the second sacrificial patterns correspond to the openings OP of the second mask pattern 121. After the first sacrificial patterns and the second sacrificial patterns are formed, the second mask pattern 121 may be removed.

Figure 6A:
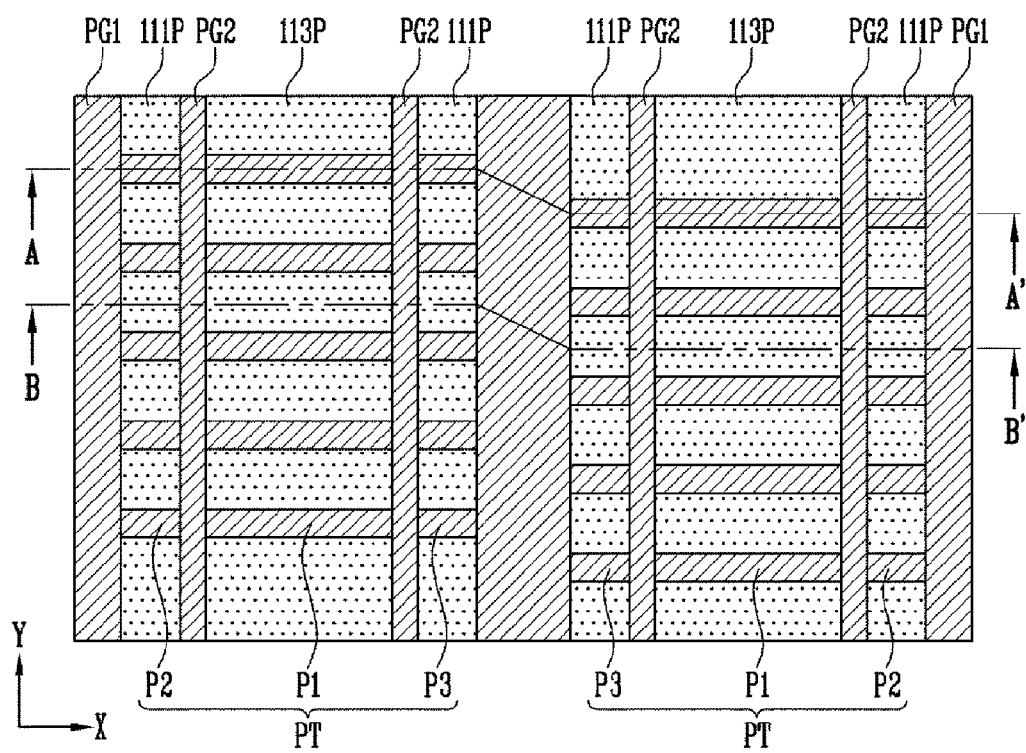
Figure 6B:
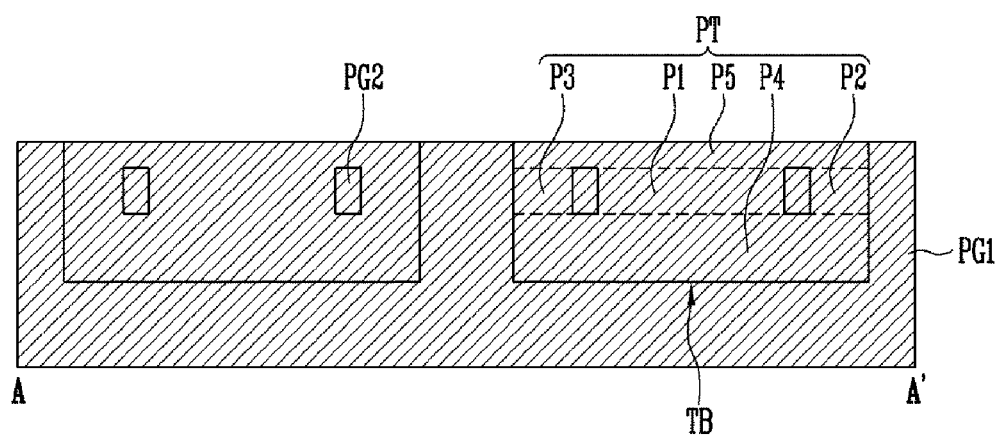

FIGS. 6A and 6B are a top plan view and a cross-sectional view for describing a representation of an example of a process of forming the partition pipe gate. Particularly, FIG. 6A is a top plan view illustrating an example of a layout of first to third patterns of the partition pipe gate, and FIG. 6B is a cross-sectional view taken along line A-A' illustrated in FIG. 6A.

Referring to FIGS. 6A and 6B, the areas, in which the first sacrificial layer, the second pipe gate, and the second sacrificial layer are removed by the processes aforementioned with reference to FIGS. 5A to 5D, are filled with the partition pipe gate PT. The partition pipe gate PT may include first to fifth patterns P1 to P5. The first pattern P1 is disposed between both ends of the second pipe gate PG2 and is filled in the partition hole H_PT. The second and third patterns P2 and P3 face with the first pattern P1 and both ends of the second pipe gate PG2 interposed therebetween, and are extended from a lateral wall of the second pipe gate PG2 to a lateral wall of the first pipe gate PG1. A fifth pattern P5 is extended from upper surfaces of the first to third patterns P1 to P3 to a height of an upper surface of the first pipe gate PG1 while being filled in the concave part C_PT (see FIG. 5D) of the second pipe gate PG2. A fourth pattern part P4 is extended from bottom surfaces of the first to third patterns P1 to P3 to the bottom surface TB of the trench T.

The aforementioned partition pipe gates PT are formed at the boundary between the first sacrificial patterns 111P and the boundary between the second sacrificial patterns 113P to separate the first sacrificial patterns 111P and the second sacrificial patterns 113P.

FIGS. 7A to 7F are cross-sectional views for describing a representation of an example of subsequent processes after the partition pipe gate PT is formed. More particularly, FIGS. 7A to 7F are cross-sectional views for each process step taken along line B-B' illustrated in FIG. 6A.

Figure 7A:
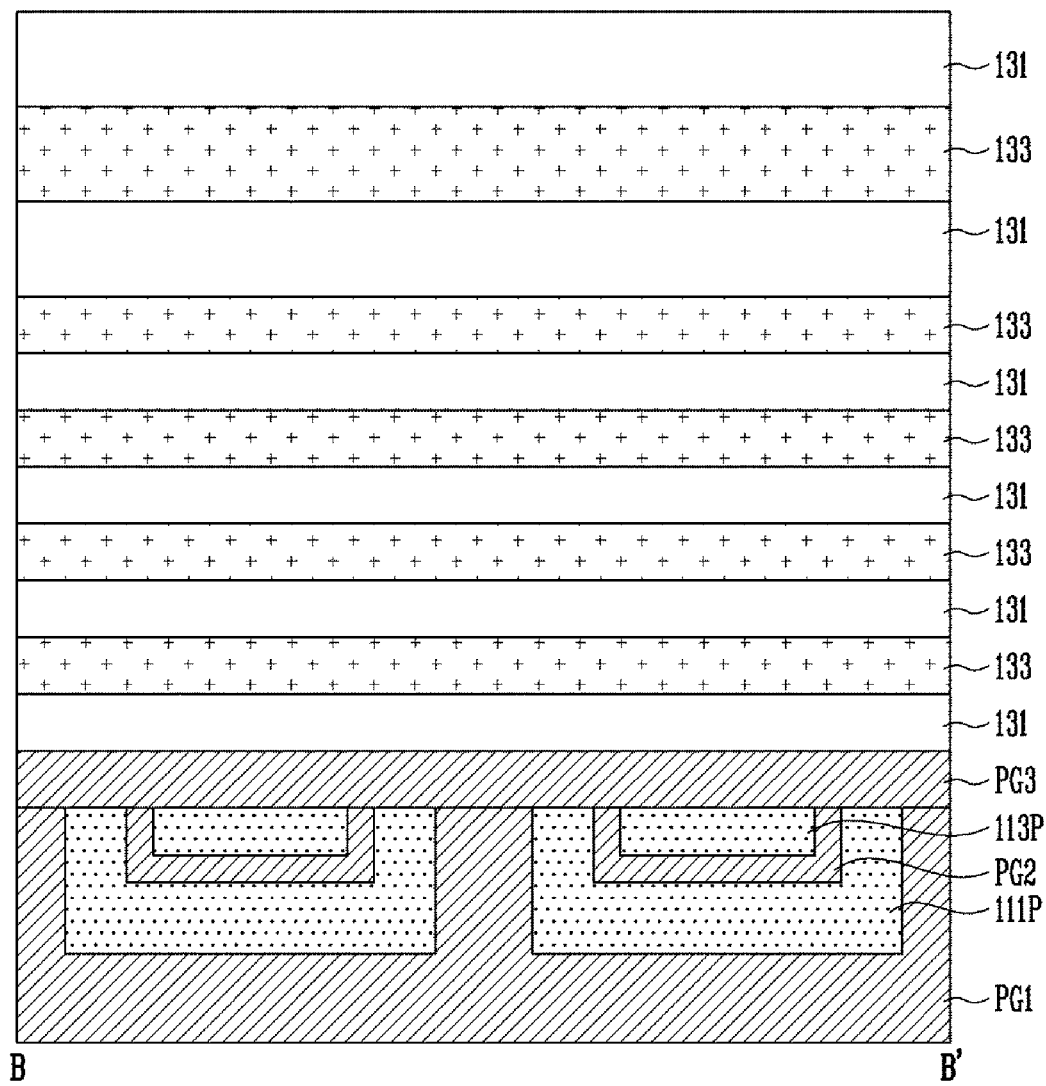

Referring to FIG. 7A, a third pipe gate PG3 covering the partition pipe gate PT, the first sacrificial patterns 111P, the second sacrificial patterns 113P, the second pipe gate PG2, and the first pipe gate PG1 may be formed. The third pipe gate PG3 may be formed of, for example, poly silicon.

Next, first material layers 131 and second material layers 133 are alternately stacked. The second material layers 133 are formed of a different material from that of the first material layers 131.

For example, the first material layers 131 may be formed of insulating layers for interlayer insulating patterns, and the second material layers 133 may be formed of conductive layers for the word lines and the select lines.

In an embodiment, the first material layers 131 may be formed of insulating layers for interlayer insulating patterns, and the second material layers 133 may be formed of sacrificial insulating layers having etch selectivity for the first material layers 131. In this example, the first material layers 131 may be formed of silicon oxide layers, and the second material layers 133 may be formed of silicon nitride layers.

In an embodiment, the first material layers 131 may be formed of sacrificial conductive layers having etch selectivity for the second material layers 133, and the second material layers 133 may be formed of conductive layers for the word lines and the select lines. In this example, the first material layers 131 may be formed of un-doped poly silicon layers, and the second material layers 133 may be formed of doped poly silicon layers.

Figure 7B:
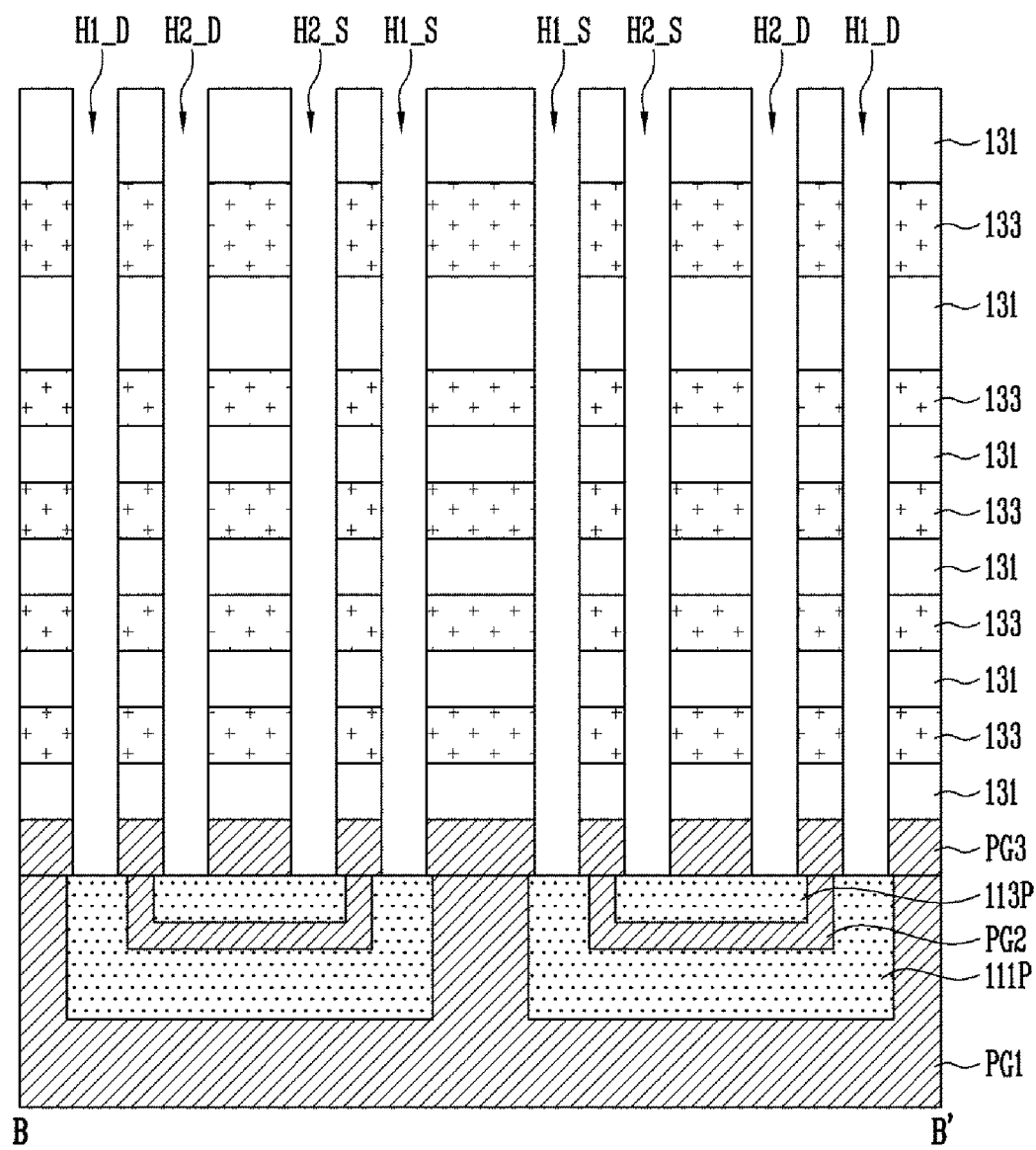

Referring to FIG. 7B, a plurality of pairs of first and second holes H1_D and H1_S exposing both ends of the first sacrificial patterns 111P and a plurality of pairs of third and fourth holes H2_D and H2_S exposing both ends of the second sacrificial patterns 113P are formed by etching the first material layers 131 and the second material layers 133. The third and fourth holes H2_D and H2_S are disposed between the first and second holes H1_D and H1_S. When the third pipe gate PG3 is formed, the third pipe gate PG3 is etched so that the first to fourth holes H1_D, H1_S, H2_D, and H2_S may further pass through the third pipe gate PG3.

According to an example of an embodiment, both ends of the first sacrificial patterns 111P and both ends of the second sacrificial patterns 113P are positioned within the same plane by the planarization process described with reference to FIGS. 4A and 4B. Accordingly, total heights of the materials disposed on both ends of the first sacrificial patterns 111P and both ends of the second sacrificial patterns 113P are similar to each other, thereby improving stability of the etch process for forming the first to fourth holes H1_D, H1_S, H2_D, and H2_S.

Figure 7C:
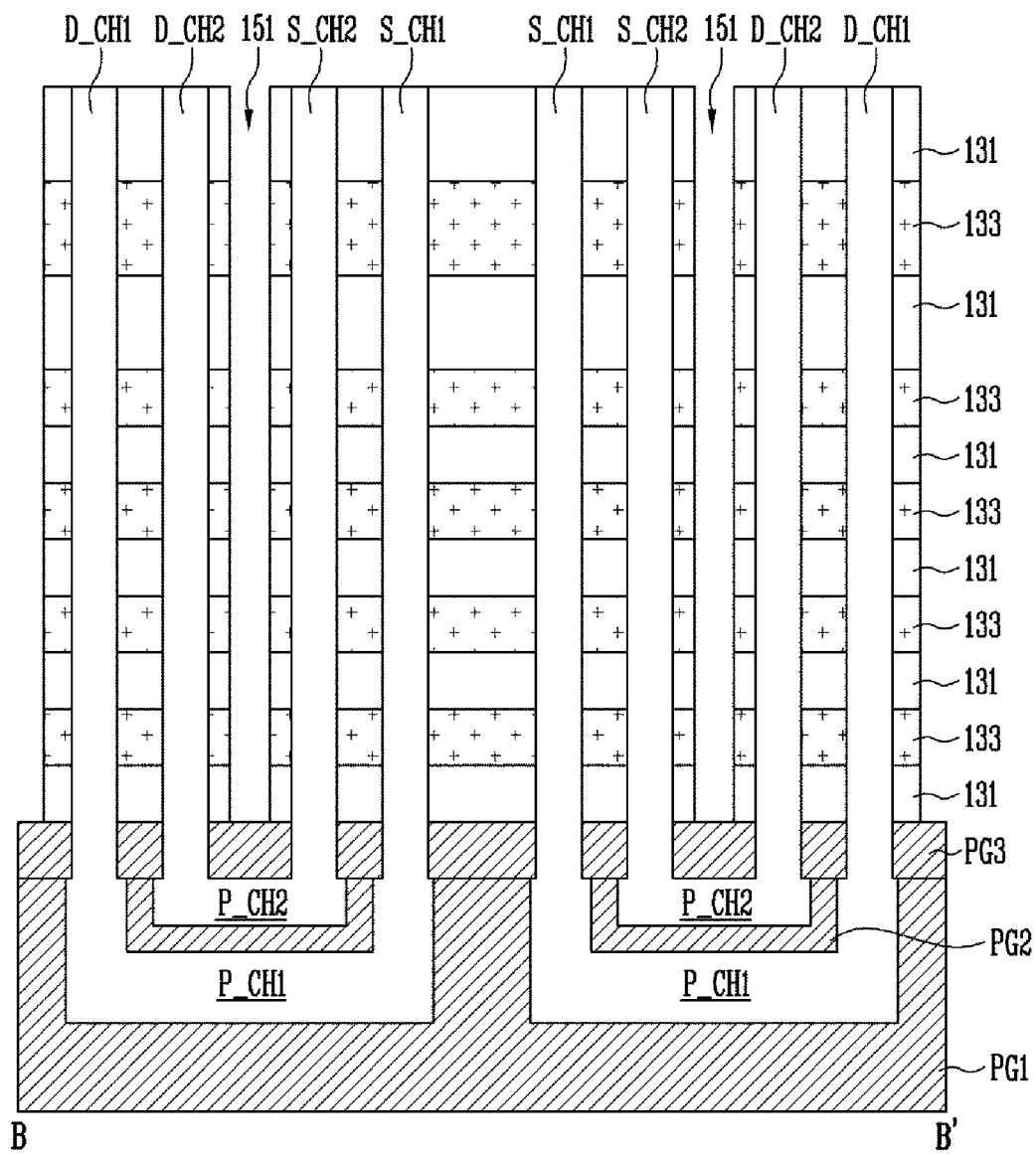

Referring to FIG. 7C, the first sacrificial patterns 111P and the second sacrificial patterns 113P exposed by the first to fourth holes H1_D, H1_S, H2_D, and H2_S are removed. Then, internal sides of the first to fourth holes H1_D, H1_S, H2_D, and H2_S, and internal sides of the areas, in which the first sacrificial patterns 111P and the second sacrificial patterns 113P are removed are filled with a semiconductor layer. Next, a surface of the semiconductor layer is planarized so that the semiconductor layer is divided in the unit of the first to fourth holes H1_D, H1_S, H2_D, and H2_S. Accordingly, a first channel layer and a second channel layer are formed.

The first channel layer includes a first pipe channel P_CH1 disposed inside each of the first channel areas, in which the first sacrificial patterns 111P are removed, first drain side channels D_CH1 disposed inside the first holes H1_D, and first source side channels S_CH1 disposed inside the second holes H1_S. The first pipe channel P_CH1 may have a U-shaped longitudinal cross-section structure, and the first drain side channel D_CH1 and the first source side channel S_CH1 may be connected to both ends of the U-shaped first pipe channel P_CH1.

The second channel layer may include a second pipe channel P_CH2 disposed inside each of the second channel areas, in which the second sacrificial patterns 113P are removed, second drain side channels D_CH2 disposed inside the third holes H2_D, and second first source side channels S_CH2 disposed inside the fourth holes H2_S. The second pipe channel P_CH2 may be disposed on the first pipe channel P_CH1, and the second drain side channel D_CH2 and the second source side channel S_CH2 may be connected to both ends of the second pipe channel P_CH2.

In the above, the semiconductor layer may be formed in a tube type, of which a center area is opened. In this example, the center area of the tube-type semiconductor layer may be filled with an insulating layer (not illustrated). In an embodiment, the semiconductor layer may be formed in a buried type which is completely filled in the internal sides of the first to fourth holes H1_D, H1_S, H2_D, and H2_S, and the areas, in which the first sacrificial patterns 111P and the second sacrificial patterns 113P are removed.

Before the semiconductor layer is formed, three or more layers including a blocking insulating layer, a data storing layer, and a tunnel insulating layer may be further formed along the internal sides of the first to fourth holes H1_D, H1_S, H2_D, and H2_S, and surfaces of the areas, in which the first sacrificial patterns 111P and the second sacrificial patterns 113P are removed.

Then, first slits 151 passing through the first and second material layers 131 and 133 are formed by etching the first and second material layers 131 and 133. The first slit 151 may pass through a space between the second drain side channel D_CH2 and the second source side channel S_CH2 which are adjacent to each other, and be formed in a unit of a memory block or a memory string.

A subsequent process may be variously changed according to the type of material of the first and second material layers 131 and 133.

For example, when the first material layers 131 are formed of the insulating layers for the interlayer insulating patterns, and the second material layers 133 are formed of the conductive layers for the word lines and the select lines, the first material layers 131 and the second material layers 133 may be divided into the source side stack structure and the drain side stack structure described with reference to FIG. 1A.

Figure 7D:
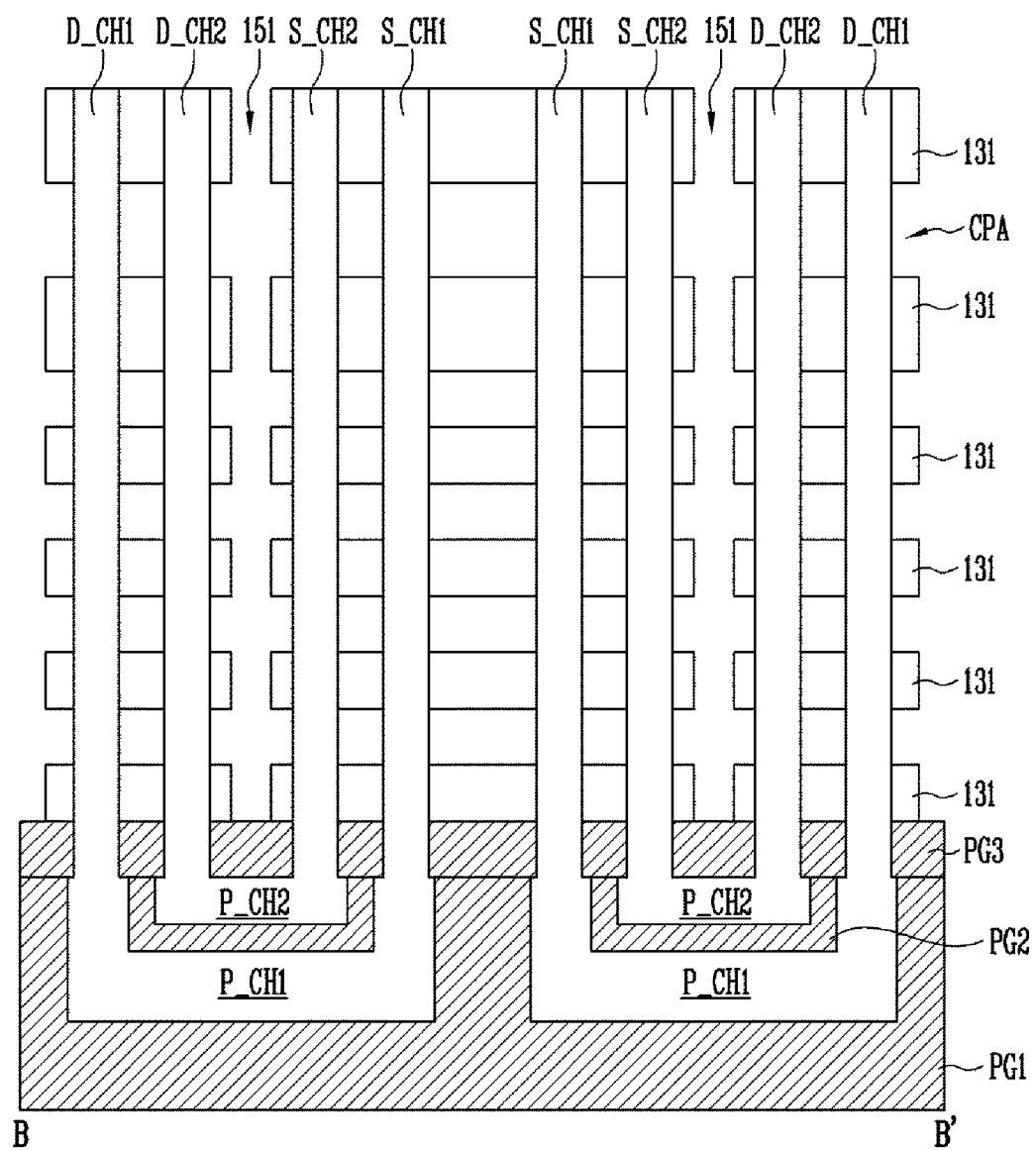
Figure 7E:
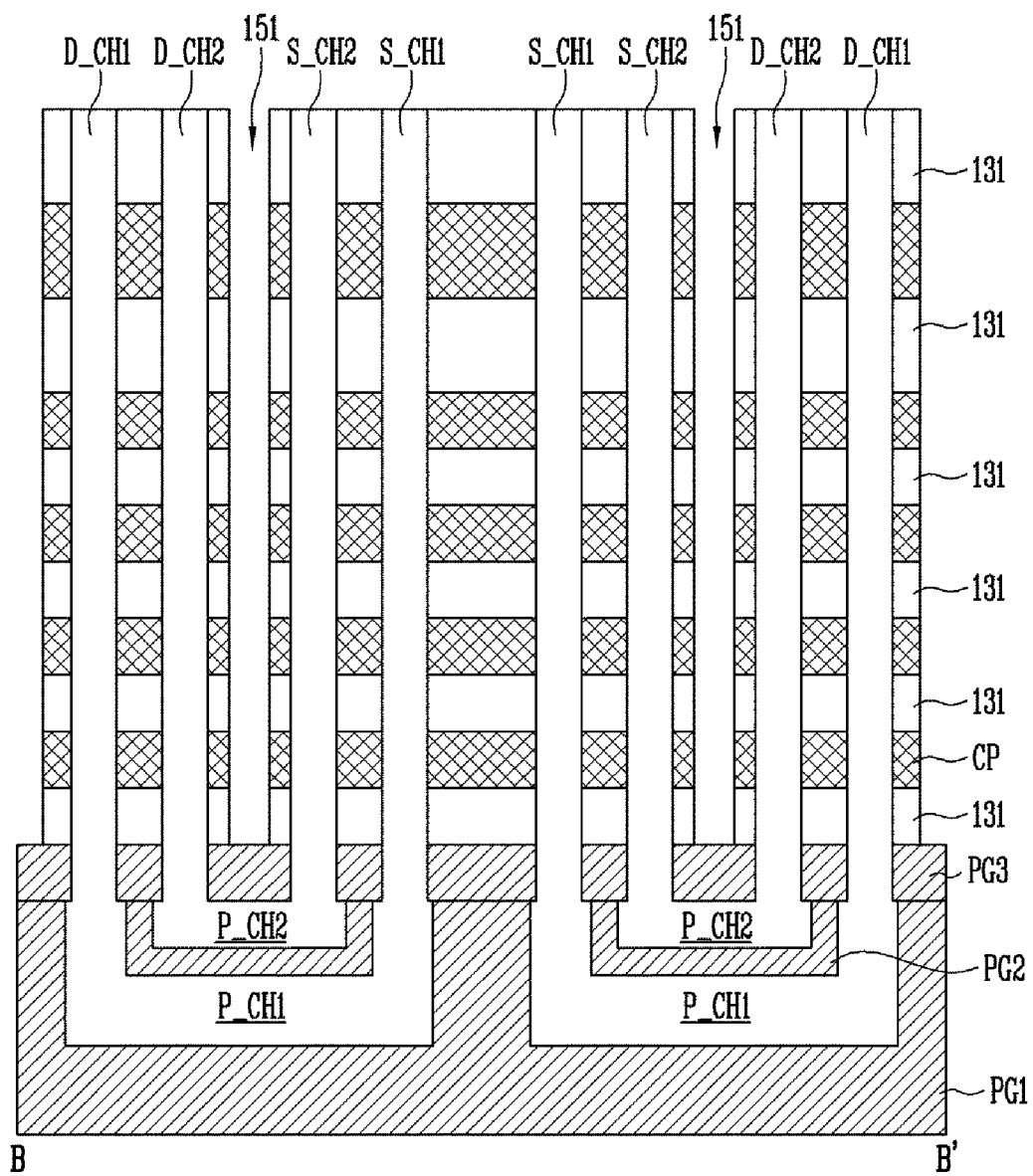

In an embodiment, when the first material layers 131 are formed of the insulating layers for the interlayer insulating patterns, and the second material layers 133 are formed of the sacrificial insulating layers, the process illustrated in FIGS. 7D and 7E are performed.

Referring to FIG. 7D, conductive pattern areas CPA between the first material layers 131 are opened by removing the second material layers 133 exposed by the first slit 151.

Referring to FIG. 7E, conductive patterns CP are formed inside the conductive pattern areas CPA, respectively. Each of the conductive patterns CPs may include at least one of a poly silicon layer, a metal silicide layer, and a metal layer. When each of the conductive patterns CP is formed of a metal layer, such as tungsten, having lower resistance than that of poly silicon, a barrier metal, such as TiN, may be further formed along a surface of each of the conductive patterns CP. When the three or more layers including the tunnel insulating layer, the data storing layer, and the blocking insulating layer are not formed before the semiconductor layer described in FIG. 7C is formed, the three or more layers including the tunnel insulating layer, the data storing layer, and the blocking insulating layer may be formed along a surface of each of the conductive pattern areas CPA before the conductive patterns CP are formed.

The conductive patterns CP may be used as word lines, a source select line, or a drain select line. For example, patterns of one or more layers from a top most layer among the conductive patterns CP may be used as a source select line or a drain select line, and the patterns thereunder may be used as word lines. The conductive patterns CP may be divided into the source side stack structure and the drain side stack structure described with reference to FIG. 1A by the first slits 151.

Although not illustrated in the drawing, when the first material layers 131 are formed of sacrificial conductive layers, and the second material layers 133 are formed of conductive layers, the first material layers 131 may be divided into the source side stack structure and the drain side stack structure by the first slits 151. The second material layers 133 exposed by the first slits 151 may be removed, so that insulating pattern areas between the first material layers 131 may be opened. The insulating pattern areas may be filled with the interlayer insulating patterns. The interlayer insulating patterns may be divided into the source side stack structure and the drain side stack structure by the first slits 151.

Figure 7F:
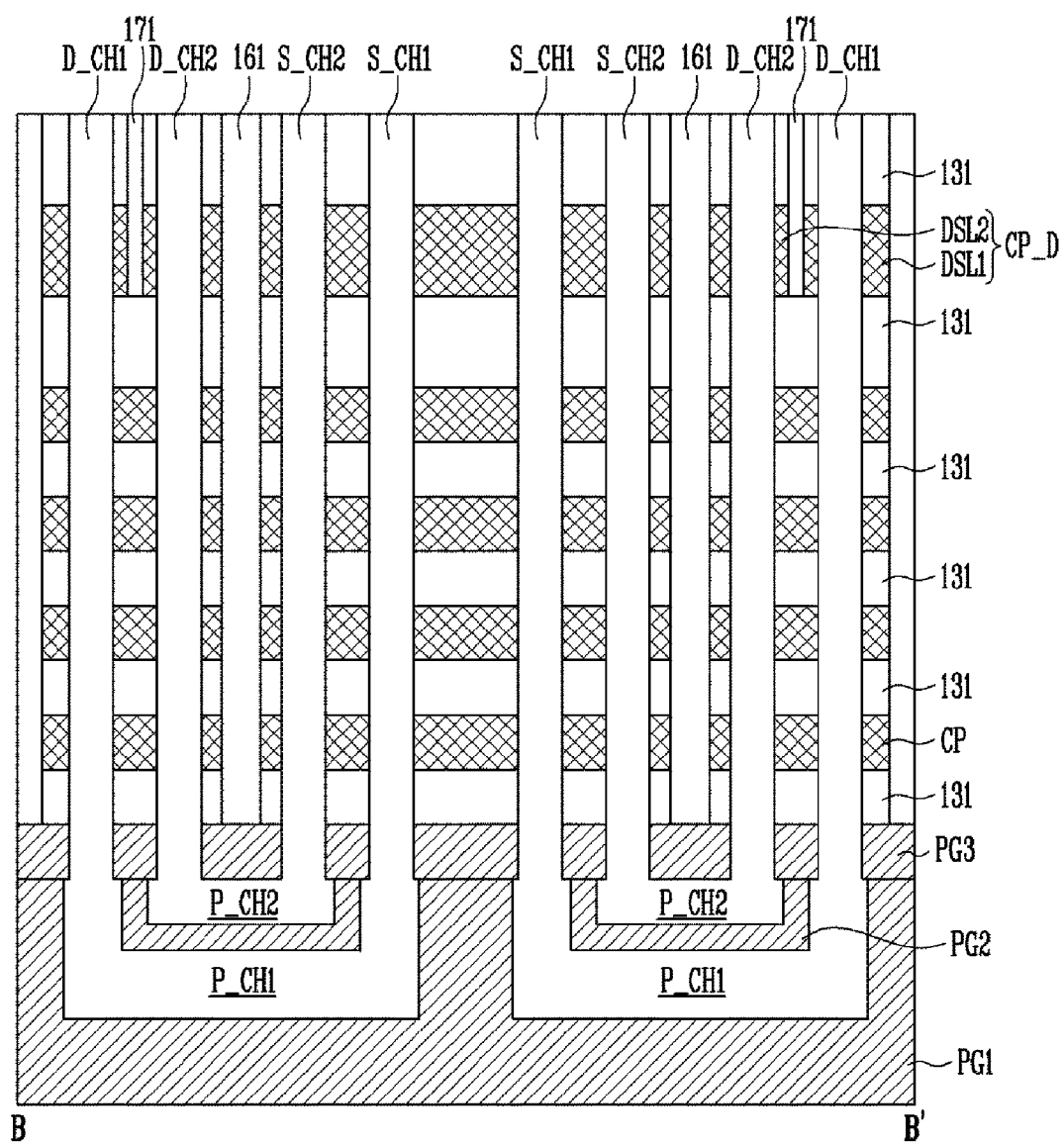

As described above, after the source side stack structure and the drain side stack structure divided by the first slits 151 and including the conductive patterns CP and the interlayer insulating patterns are formed, a process illustrated in FIG. 7F may be performed.

Referring to FIG. 7F, the first slit 151 is filled with a first slit insulating layer 161. Next, a second slit insulating layer 171 passing through the conductive patterns disposed on at least one layer from the top most layer among the conductive patterns CP may be further formed.

For example, a drain side conductive pattern CP_D on the topmost layer among the conductive patterns simultaneously surrounding the first and second drain side channels D_CH1 and D_CH2 may be divided into a first drain select line DSL1 surrounding the first drain side channels D_CH1 and a second drain select line DSL2 surrounding the second drain side channels D_CH2. The second slit insulating layer 171 may be formed by forming the second slit until the target conductive pattern passes through, and then filling inside the second slit with an insulating material.

In the above, a disposition form and a location of the second slit insulating layer 171 may be variously changed.

According to the aforementioned example of an embodiment, even though an alignment degree is not controlled by using a photolithography device, the second pipe channel P_CH2 may be automatically aligned on the first pipe channel P_CH1. Accordingly, in an example of an embodiment, it may be possible to form an overlapping structure of the dual pipe channels by a simplified process.

Figure 8:
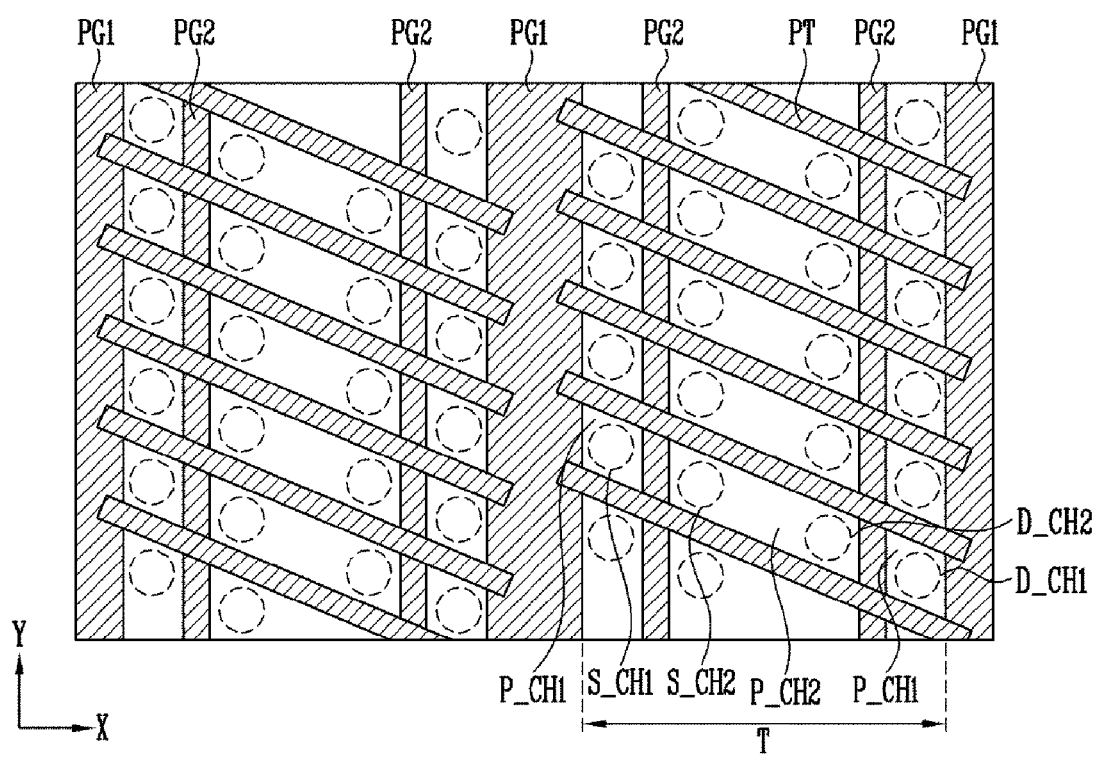
FIG. 8 is a diagram for describing a representation of an example of a structure of a pipe gate according to an embodiment.

FIG. 8 is a diagram for describing a representation of an example of a structure of the pipe gate according to an embodiment. Referring to FIG. 8, the pipe gate according to an embodiment may include the first pipe gate PG1 extended in the first direction (Y-direction) identically to that described with reference to FIGS. 2A to 2D. The trench T of the first pipe gate PG1 may be divided into a first space and a second space by the second pipe gate PG2 as described with reference to FIGS. 2A to 2C. The second pipe gate PG2 includes a partition hole and a concave part as described with reference to FIG. 2D.

An arrangement direction of the partition hole and the concave part may be changed by the extended direction of the partition pipe gate PT. The partition pipe gate PT illustrated in FIG. 8 is extended in a direction different from the extended direction of the partition pipe gate described with reference to FIGS. 2A to 2D. For example, the partition pipe gate PT illustrated in FIG. 8 may be extended in a direction obliquely crossing the extended direction (Y-direction) of the trench T. The partition pipe gate PT divides the first space under the second pipe gate PG2 into first channel areas in which the first pipe channels P_CH1 are disposed, and the second space S2 above the second pipe gate PG2 into second channel areas in which the second pipe channels P_CH2 are disposed as described with reference to FIGS. 2A to 2D. The partition pipe gate PT may include the first to fifth patterns as described with reference to FIG. 2D.

Each of the first pipe channel P_CH1 and the second pipe channel P_CH2 may be extended in the extended direction of the partition pipe gate PT. For example, each of the first pipe channel P_CH1 and the second pipe channel P_CH2 may be obliquely extended in the extended direction (Y-direction) of the trench T.

The first drain side channel D_CH1 and the first source side channel S_CH1 connected to the first pipe channel P_CH1 may be disposed in the extended direction of the partition pipe gate PT. For example, the first drain side channel D_CH1 and the first source side channel S_CH1 may be obliquely disposed in the extended direction (Y-direction) of the trench T.

The second drain side channel D_CH2 and the second source side channel S_CH2 connected to the second pipe channel P_CH2 may be disposed in the extended direction of the partition pipe gate PT. For example, the second drain side channel D_CH2 and the second source side channel S_CH2 may be obliquely disposed in the extended direction (Y-direction) of the trench T.

According to the various embodiments, the line-type trench extended in a predetermined direction may be formed inside the first pipe gate, and the internal side of the trench may be divided into the first and second channel areas by using the second pipe gate and the partition pipe gate, thereby improving integration of the memory device.

According to the various embodiments, the first and second channel areas may be divided by a simplified process using a shape of the surface of the trench formed inside the first pipe gate.

Figure 9:
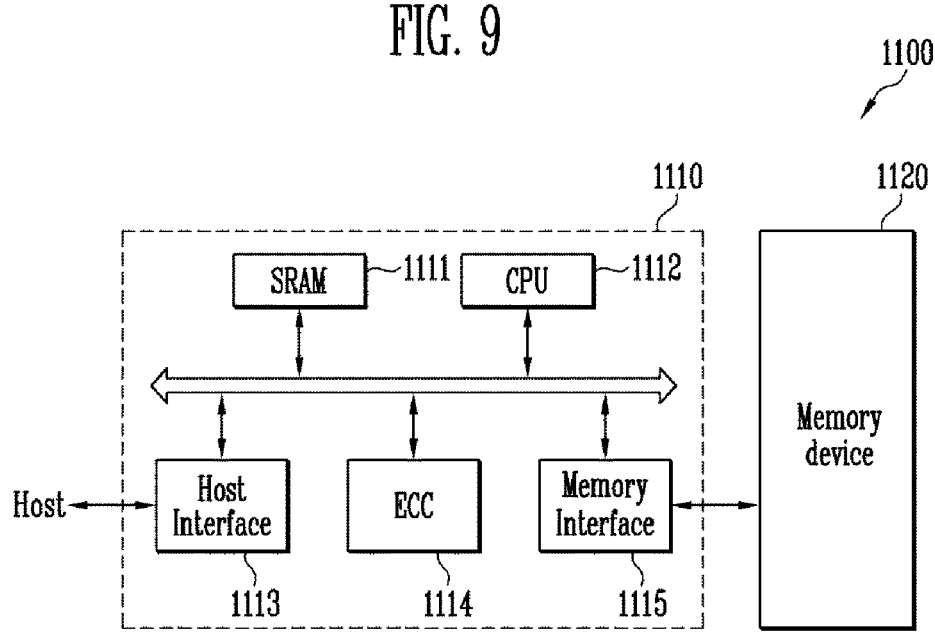
FIG. 9 is a configuration diagram illustrating a representation of an example of a memory system according to an embodiment.

FIG. 9 is a configuration diagram illustrating a representation of an example of a memory system according to an embodiment.

Referring to FIG. 9, a memory system 1100 according to an example of an embodiment may include a memory device 1120 and a memory controller 1110.

The memory device 1120 may include the structures of the various embodiments described above with reference to FIGS. 1A to 8. Further, the memory device 1120 may be a multi-chip package formed of a plurality of flash memory chips.

The memory controller 1110 may be configured to control the memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol of the host connected to the memory system 1100. The ECC 1114 detects and corrects an error included in data read from the memory device 1120, and the memory interface 1115 performs interfacing with the memory device 1120. The memory controller 1110 may further include an ROM and the like for storing code data for the interfacing with the host.

As described above, the memory system 1100 including the aforementioned configuration may be a memory card or a Solid State Disk (SSD) in which the memory device 1120 is combined with the memory controller 1110. For example, when the memory system 1100 is the SSD, the memory controller 1110 may communicate with an external device (for example, a host) through one of various interface protocols, such as, for example but not limited to, USB, MMC, PCI-E, SATA, PATA, SCSI, ESDI, and IDE.

Figure 10:
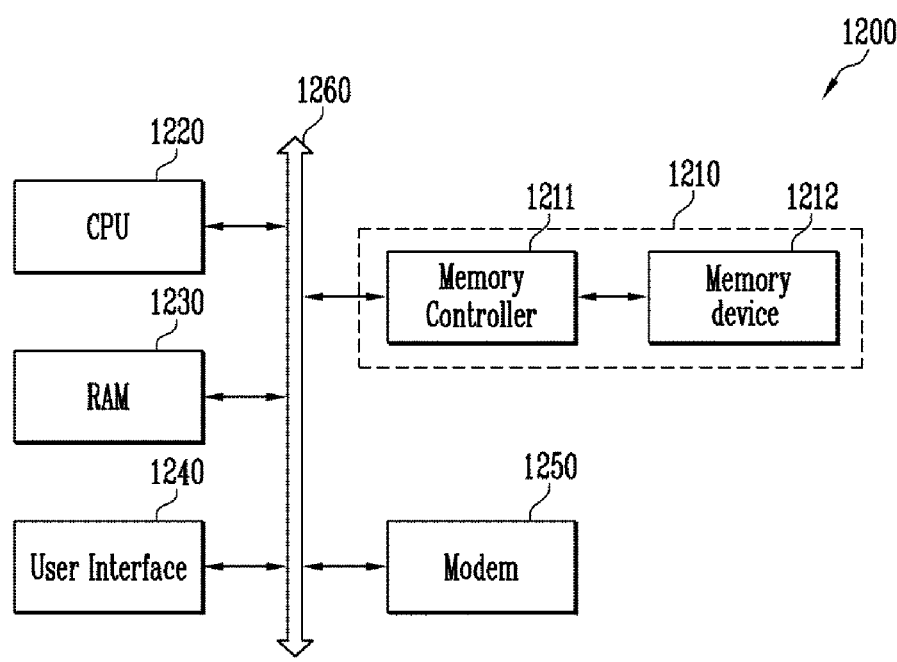
FIG. 10 is a configuration diagram illustrating a representation of an example of a computing system according to an embodiment.

FIG. 10 is a configuration diagram illustrating a representation of an example of a computing system according to an embodiment.

Referring to FIG. 10, a computing system 1200 according to an embodiment may include a CPU 1220, a RAM 1230, a user interface 1240, a modem 1250, and a memory system 1210, which are electrically connected to a system bus 1260. Further, in an example where the computing system 1200 is a mobile device, the computing system 1200 may further include a battery for supplying an operational voltage to the computing system 1200, and may further include an application chip-set, a camera image sensor CIS, a mobile DRAM, and the like.

The memory system 1210 may be formed of a memory device 1212 and a memory controller 1211 as previously described with reference to FIG. 9.

As described above, the embodiments have been disclosed with reference to the drawings and the specification. The specific terms used herein are for purposes of illustration, and do not limit the scope of the application. Accordingly, those skilled in the art will appreciate that various modifications and another equivalent example may be made without departing from the scope and spirit of the present disclosure.

What is claimed is:

1. A semiconductor device, comprising:
 a first pipe gate including a trench extended in a first direction;
 a second pipe gate formed in the first direction and spaced apart from a surface of the trench, and configured to divide the trench into a first space and a second space;
 a partition pipe gate extended in a second direction crossing the first direction, and configured to divide the first space into first areas, and divide the second space into second areas;
 a first pipe channel formed inside each of the first areas; and
 a second pipe channel formed inside each of the second areas,
 wherein the second pipe gate has concave parts at both ends of the second pipe gate, the concave parts disposed between the first space and the second space, and
 wherein the partition pipe gate is inserted into the concave parts.

2. The semiconductor device of claim 1,
 wherein the first space substantially has a U-shaped longitudinal cross-section structure; and
 wherein the second pipe gate substantially has a U-shaped longitudinal cross-section structure.

3. The semiconductor device of claim 2,
 wherein the first space having the substantially U-shaped longitudinal cross-section structure is extended in the first direction; and
 wherein the second pipe gate having the substantially U-shaped longitudinal cross-section structure is extended in the first direction.

4. The semiconductor device of claim 1, wherein the first pipe channel substantially has a U-shaped longitudinal cross-section structure.

5. The semiconductor device of claim 1, wherein the partition pipe gate includes:
 a first pattern disposed inside the second space in contact with a lateral wall of the second pipe gate, and extended in the second direction;
 second and third patterns disposed on an extended line of the first pattern, and in contact with the lateral wall of the second pipe gate and a lateral wall of the first pipe gate within the first space at both sides of the first pattern;
 a fourth pattern extended from bottom surfaces of the first to third patterns to the surface of the trench, and passing through a bottom surface of the second pipe gate; and
 a fifth pattern extended from upper surfaces of the first to third patterns to a height of an upper surface of the first pipe gate, and inserted into the concave parts.

6. The semiconductor device of claim 5, wherein the second pipe gate further includes a partition hole passed through by the first pattern.

7. The semiconductor device of claim 1, further comprising:
 a first drain side channel and a first source side channel protruding from respective ends of the first pipe channel to an upper side of the second pipe gate; and
 a second drain side channel and a second source side channel protruding from respective ends of the second pipe channel to an upper side of the second pipe gate.

8. The semiconductor device of claim 7, further comprising:
 drain side interlayer insulating patterns and drain side conductive patterns alternately stacked on the second pipe gate while surrounding the first drain side channel and the second drain side channel, and
 source side interlayer insulating patterns and source side conductive patterns alternately stacked on the second pipe gate while surrounding the first source side channel and the second source side channel.

9. The semiconductor device of claim 7, further comprising:
 a third pipe gate configured to cover the partition pipe gate, the first and second pipe gates, and the first and second pipe channels, and passed through by the first and second drain side channels and the first and second source side channels.

10. The semiconductor device of claim 1, wherein the partition pipe gate vertically or obliquely crosses with respect to the first direction.

\* \* \* \* \*